(12) United States Patent
Koo et al.

(10) Patent No.: US 10,631,408 B2
(45) Date of Patent: Apr. 21, 2020

(54) APPARATUS INCLUDING POLYMER LAYER AND METHOD OF MANUFACTURING SAME

(71) Applicant: SAMSUNG ELECTRONICS CO., LTD., Suwon-si, Gyeonggi-do (KR)

(72) Inventors: Won-Kyu Koo, Gumi-si (KR); Jin-Man Kim, Gumi-si (KR); Hyung-Sup Byeon, Suwon-si (KR); Hyun-Suk Choi, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/994,207

(22) Filed: May 31, 2018

(65) Prior Publication Data

US 2019/0037694 A1    Jan. 31, 2019

(30) Foreign Application Priority Data

Jul. 26, 2017    (KR) .................... 10-2017-0094808

(51) Int. Cl.
*H05K 1/11* (2006.01)
*G06F 1/16* (2006.01)
(Continued)

(52) U.S. Cl.
CPC ........... *H05K 1/118* (2013.01); *G06F 1/1652* (2013.01); *G06F 3/041* (2013.01); *G06F 3/0412* (2013.01);
(Continued)

(58) Field of Classification Search
CPC ...... G06F 1/1652; G06F 3/041; G06F 3/0412; G06F 2203/04102; G06F 2203/04103;
(Continued)

(56) References Cited

U.S. PATENT DOCUMENTS

| | | | |
|---|---|---|---|
| 2010/0020041 A1* | 1/2010 | Park ..................... | G06F 3/0412 345/174 |
| 2012/0020056 A1* | 1/2012 | Yamagata ......... | G02F 1/133308 362/97.1 |

(Continued)

FOREIGN PATENT DOCUMENTS

| | | |
|---|---|---|
| KR | 10-2014-0048633 | 4/2014 |
| KR | 10-2014-0128733 | 11/2014 |

(Continued)

*Primary Examiner* — Roshn K Varghese
(74) *Attorney, Agent, or Firm* — Nixon & Vanderhye P.C.

(57) ABSTRACT

According to various embodiments, the electronic device may include: a glass plate having a first face that faces in a first direction, a second face that faces in a second direction opposite the first direction, and a side face that faces in a third direction perpendicular to the first direction; a flexible PCB having a first face that faces the second face of the glass plate in the first direction, and a second face that faces in the second direction; a flexible display layer having a flat portion that is disposed between the second face of the glass plate and the first face of the flexible PCB, and a bent portion that extends from the flat portion and is bent to be connected to the flexible PCB; a polymer layer having a first face that faces in the first direction and is attached to the second face of the flexible PCB and a second face that faces in the second direction; and a cover structure that is connected to the glass plate and the polymer layer so as to enclose at least a part of the flexible PCB, the flexible display layer, and the polymer layer.

14 Claims, 19 Drawing Sheets

(51) Int. Cl.
*G06F 3/041* (2006.01)
*H05K 1/02* (2006.01)

(52) U.S. Cl.
CPC ... *H05K 1/028* (2013.01); *G06F 2203/04102* (2013.01); *G06F 2203/04103* (2013.01); *G06F 2203/04105* (2013.01); *H05K 2201/09063* (2013.01); *H05K 2201/10128* (2013.01)

(58) Field of Classification Search
CPC .......... G06F 2203/04105; H05K 1/118; H05K 1/028; H05K 1/147; H05K 2201/09063; H05K 2201/10128
See application file for complete search history.

(56) References Cited

U.S. PATENT DOCUMENTS

| | | | |
|---|---|---|---|
| 2014/0103315 A1 | 4/2014 | Jung et al. | |
| 2014/0140018 A1* | 5/2014 | Malek | H04M 1/0277 361/749 |
| 2014/0268595 A1* | 9/2014 | Eom | H05K 1/028 361/749 |
| 2014/0319523 A1 | 10/2014 | Lee | |
| 2015/0021570 A1* | 1/2015 | Kim | H01L 51/0097 257/40 |
| 2015/0055058 A1* | 2/2015 | Jang | G02F 1/133603 349/65 |
| 2015/0216053 A1* | 7/2015 | Sauer | H05K 1/141 361/783 |
| 2016/0066419 A1* | 3/2016 | Kamei | H05K 1/0393 174/254 |
| 2016/0088726 A1* | 3/2016 | Jeon | G02F 1/13452 361/749 |
| 2016/0198560 A1 | 7/2016 | Shin et al. | |
| 2016/0270234 A1 | 9/2016 | Ahn | |

FOREIGN PATENT DOCUMENTS

| | | |
|---|---|---|
| KR | 10-2016-0085388 | 7/2016 |
| KR | 10-2016-0087056 | 7/2016 |
| KR | 10-2016-0110861 | 9/2016 |

\* cited by examiner

APPARATUS INCLUDING POLYMER LAYER AND METHOD OF MANUFACTURING SAME

CROSS-REFERENCE TO RELATED APPLICATION

This application is based on and claims priority under 35 U.S.C. § 119(a) to Korean Patent Application Serial No. 10-2017-0094808, which was filed in the Korean Intellectual Property Office on Jul. 26, 2017, the disclosure of which is hereby incorporated herein by reference in its entirety.

FIELD

Various embodiments relate to a device including a polymer layer and a method of manufacturing the same using the polymer layer.

BACKGROUND

Due to the remarkable development of information communication technology and semiconductor technology, the distribution and use of various electronic devices are rapidly increasing. In particular, recent electronic devices are being developed such that users can communicate with each other while carrying the electronic devices.

Such electronic devices may mean devices that perform specific functions according to programs incorporated therein, including an electronic scheduler, a portable multimedia reproducer, a mobile communication terminal, a tablet PC, an image/sound device, a desktop PC, a laptop PC, a vehicular navigation system, and home appliances. For example, the above-mentioned electronic devices may output information stored therein as sound or an image. As the integration degree of such electronic devices has increased, and super-high speed and large capacity wireless communication has become popular, various functions have recently been provided in a single electronic device, such as a mobile communication terminal. For example, in addition to a communication function various functions, such as an entertainment function (e.g., a game function), a multimedia function (e.g., a music/video reproducing function), a communication and security function for mobile banking, a schedule management function, and an e-wallet function, are integrated in a single electronic device. Such an electronic device has been miniaturized so that the user can conveniently carry the electronic device.

A display device used in such an electronic device may include a display element layer having a plurality of signal lines and a plurality of pixels, a Printed Circuit Board (PCB) having a control circuit formed thereon so as to send a control signal to the display element layer, and a wiring layer which is a region of the display element layer to which the PCB is connected. One end of the wiring layer extends from a board pad region in the display element layer and the other end of the wiring layer is attached to the PCB in order to expand a mounting space in the electronic device. Then, a partial region of an end portion of the display layer is bent by a bending process, and the end portion, the wiring layer, and the PCB are positioned to face the display element layer.

SUMMARY

When a bending process of a display panel is performed such that a partial region of a display element layer and a PCB are disposed to face each other, a partial region of the PCB may be suctioned using a vacuum suction device, and may be disposed on the rear side of the display element layer using a rotary device. In the bending process, a partial region (e.g., the wiring layer) of the display device is designed as a thin film structure having a very low rigidity. When flatness is not maintained uniformly during the vacuum suction and rotation, circuit line deformation (e.g., crack and/or disconnection) within the wiring layer may occur according to deformation, resulting in a defect in the display device.

A device including a polymer layer according to various example embodiments and a method of manufacturing the device using the polymer layer are intended to prevent (or reduce the likelihood of) a circuit line in the wiring layer from being deformed using the polymer layer used in the bending process.

A device including a polymer layer according to various example embodiments and a method of manufacturing the device using the polymer layer are intended to secure a suction region, the flatness of which is evenly maintained by attaching the polymer layer used in a bending process to a region of the PCB.

According to various example embodiments, the electronic device may include: a glass plate having a first face that faces in a first direction, a second face that faces in a second direction opposite the first direction, and a side face that faces in a third direction substantially perpendicular (perpendicular plus/minus ten degrees) to the first direction; a flexible PCB having a first face that faces the second face of the glass plate in the first direction, and a second face that faces in the second direction; a flexible display layer having a flat portion that is disposed between the second face of the glass plate and the first face of the flexible PCB, and a bent portion that extends from the flat portion and is bent to be connected to the flexible PCB; a polymer layer having a first face that faces in the first direction and is attached to the second face of the flexible PCB and a second face that faces in the second direction; and a cover structure that is connected to the glass plate and the polymer layer so as to enclose at least a part of the flexible PCB, the flexible display layer, and the polymer layer.

According to various example embodiments, a method of manufacturing an electronic device may include: maintaining a first structure including a PCB having a first face and a second face and a polymer layer attached to the first face of the PCB; attaching a part of the second face of the PCB to a first face of the flexible display layer; and bending a part of the display layer away from the first structure such that a part of the second face of the display layer faces the second face of the PCB. The second face of the display layer may face away from the first face of the display layer.

According to various example embodiments, a method of manufacturing an electronic device having an a component that includes: a glass plate having a first face that faces in a first direction, a second face that faces in a second direction opposite the first direction, and a side face that faces in a third direction substantially perpendicular to the first direction; a flexible PCB having a first face that faces the second face of the glass plate in the first direction, and a second face that faces in the second direction; a flexible display layer having a flat portion that is disposed between the second face of the glass plate and the first face of the flexible PCB, and a bent portion that extends from the flat portion and is bent to be connected to the flexible PCB; a polymer layer having a first face that faces in the first direction and is attached to the second face of the flexible PCB and a second face that faces in the second direction; and a cover structure that is connected to the glass plate and the polymer layer so as to enclose at least a part of the flexible PCB, the flexible display layer, and the polymer layer. The method may include: removing the cover structure and the polymer layer from the component by applying heat to the cover structure; and attaching at least one of a camera and a speaker to the component.

A device including a polymer layer according to various example embodiments and a method of manufacturing the device using the polymer layer make it possible to prevent (or reduce the likelihood of) a circuit line in the wiring layer from being deformed using the polymer layer used in the bending process.

A device including a polymer layer according to various example embodiments and a method of manufacturing the device using the polymer layer make it possible to secure a suction region, the flatness of which is evenly maintained by attaching the polymer layer used in a bending process to a region of the PCB.

BRIEF DESCRIPTION OF THE DRAWINGS

The above and other aspects, features, and advantages of the present disclosure will be more apparent from the following detailed description taken in conjunction with the accompanying drawings, in which:

FIGS. 3A, 3B and 3C are views illustrating a device including a display device and a polymer layer, according to one of various embodiments, in which FIG. 3A is a view simply illustrating a cross section of the device, FIG. 3B is a plan view in which the device is viewed in a second (−Z) direction in FIG. 3A, and FIG. 3C is a cross-sectional view illustrating FIG. 3A in detail;

DETAILED DESCRIPTION

Figure 1:
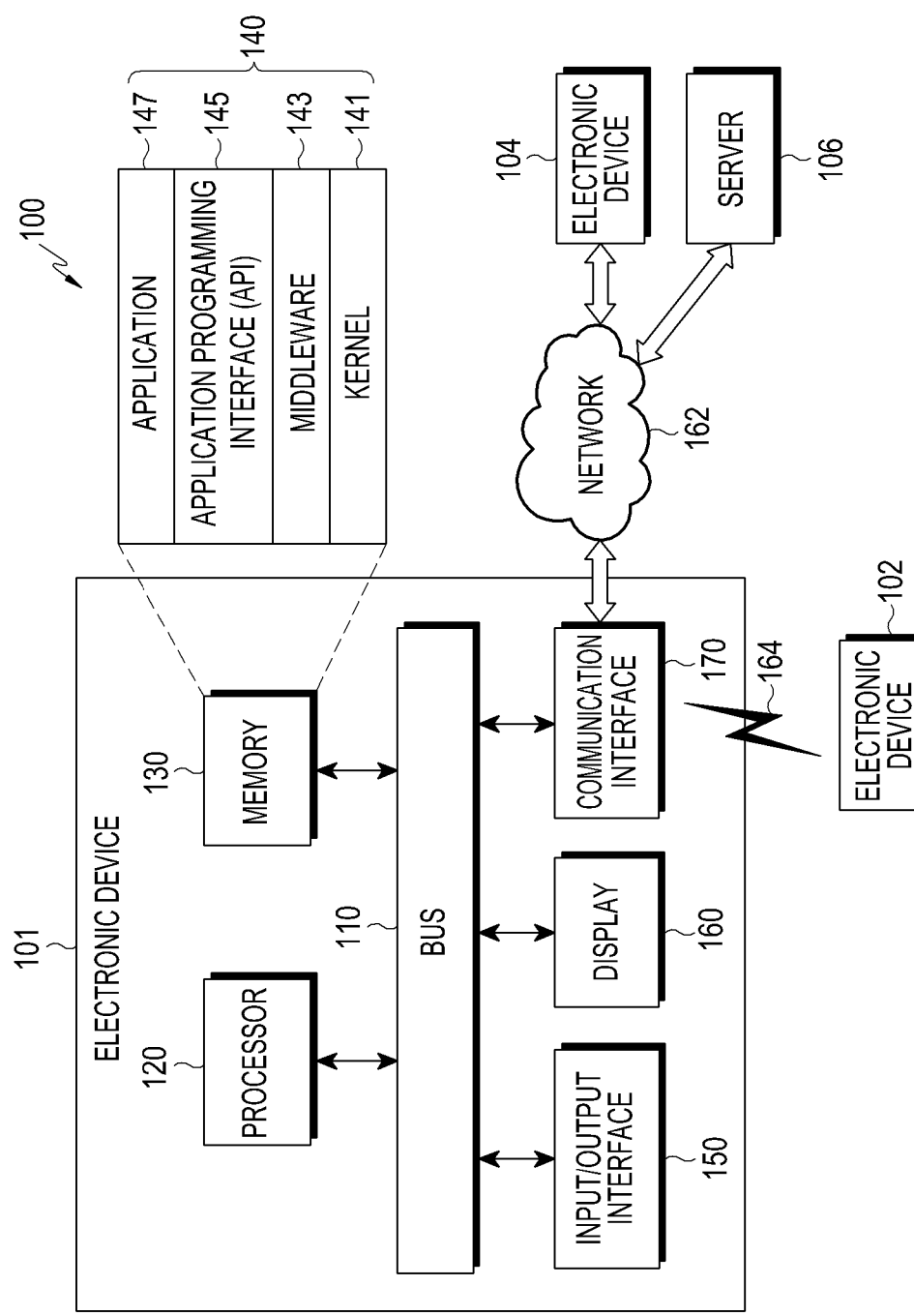
FIG. 1 is a block diagram illustrating an electronic device 101 within a network environment 100, according to one of various embodiments.

Hereinafter, various embodiments will be described with reference to the accompanying drawings. However, it should be understood that there is no intent to limit the present disclosure to the particular forms disclosed herein; rather, the present disclosure should be construed to cover various modifications, equivalents, and/or alternatives of embodiments. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical and scientific terms, have the same meaning as those commonly understood by a person skilled in the art to which the present disclosure pertains. Such terms as those defined in a generally used dictionary may be interpreted to have the meanings equal to the contextual meanings in the relevant field of art, and are not to be interpreted to have ideal or excessively formal meanings unless clearly defined in the present disclosure. In some cases, even the term defined in the present disclosure should not be interpreted to exclude embodiments.

An electronic device according to various embodiments may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment is not limited to the aforementioned devices, and may include a new electronic device according to the development of technology.

Hereinafter, an electronic device according to various embodiments will be described with reference to the accompanying drawings. In the present disclosure, the term "user" may indicate a person using an electronic device or a device (e.g., an artificial intelligence electronic device) using an electronic device.

An electronic device 101 within the network environment 100, in various embodiments, will be described with reference to FIG. 1. The electronic device 101 may include a bus 110, a processor 120, a memory 130, an input/output interface 150, a display 160, and a communication interface 170. In a certain embodiment, at least one of the above-mentioned components may be omitted from the electronic device 101 or the electronic device may additionally include other components. The bus 110 may include a circuit that interconnects the above-mentioned components 110 to 170 and transfers communication information (e.g., a control message or data) among the components 110 to 170. The processor 120 may include one or more of a Central Processing Unit (CPU), an Application Processor (AP), and a Communication Processor (CP). The processor 120 may execute, for example, an arithmetic operation or data processing that is related to the control and/or communication of one or more other components of the electronic device 101.

The memory 130 may include a volatile memory or a non-volatile memory. The memory 130 may store, for example, commands or data that are related to one or more other components of the electronic device 101. According to one embodiment, the memory 130 may store software or a program 140. The program 140 may include, for example, a kernel 141, a middleware 143, an Application Programming Interface (API) 145, or an application program ("application") 147. At least one of the kernel 141, the middleware 143, and the API 145 may be referred to as an Operating System (OS). The kernel 141 may control or manage, for example, system resources (e.g., the bus 110, the processor 120, and the memory 130) that are used for executing operations or functions implemented in the other programs (e.g., the middleware 143, the API 145, or the application 147). In addition, the kernel 141 may provide an interface that allows the middleware 143, the API 145, or the application 147 to access individual components of the electronic device 101 so as to control or manage the system resources.

The middleware 143 may play an intermediary role such that, for example, the API 145 or the application 147 may communicate with the kernel 141 so as to exchange data. In addition, the middleware 143 may process one or more task requests which are received from the applications 147, according to priority. For example, the middleware 143 may assign the priority to be capable of using a system resource of the electronic device 101 (e.g., the bus 110, the processor 120, or the memory 130) to at least one of the applications 147, and may process the one or more task requests. The input/output interface 150 may transmit commands or data, which are entered from, for example, a user or any other external device, to the other component(s) of the electronic device 101, or may output commands or data, which are received from the other component(s) of the electronic device 101, to the user or the other external device.

The display device 160 may include, for example, a Liquid Crystal Display (LCD), a Light Emitting Diode (LED) display, an Organic Light Emitting Diode (OLED) display, a MicroElectroMechanical System (MEMS) display, or an electronic paper display. The display 160 may display various contents (e.g., text, image, video, icon, or symbol) to, for example, the user. The display 160 may include a touch screen, and may receive a touch input, a gesture input, a proximity input, or a hovering input that is made using, for example, an electronic pen or a part of the user's body. The communication interface 170 may set, for example, communication between the electronic device 101 and an external device (e.g., a first external electronic device 102, a second external device 104, or a server 106). For example, the communication interface 170 may be connected with a network 162 through wired or wireless communication so as to communicate with the external device (e.g., the second external electronic device 104 or the server 106).

The wireless communication may include a cellular communication that uses at least one of, for example, Long-Term Evolution (LTE), LTE Advance (LTE-A), Code Division Multiple Access (CDMA), Wideband CDMA (WCDMA), Universal Mobile Telecommunication System (UMTS), Wireless Broadband (WiBro), and Global System for Mobile communication (GSM). According to one embodiment, as illustrated as an element 164 in FIG. 1, the wireless communication may include at least one of, for example, Wireless Fidelity (Wi-Fi), Light Fidelity (Li-Fi), Bluetooth, Bluetooth Low Energy (BLE), ZigBee, Near Field Communication (NFC), Magnetic Secure Transmission (MST), Radio Frequency (RF), and Body Area Network (BAN). According to one embodiment, the wireless communication may include GNSS. The GNSS may be, for example, a Global Positioning System (GPS), a Global navigation satellite system (Glonass), a Beidou navigation satellite system (hereinafter, "Beidou"), Galileo, or an European global satellite-based navigation system. Herein, "GPS" may be interchangeably used with "GNSS" below. The wired communication may use at least one of, for example, Universal Serial Bus (USB), High Definition Multimedia Interface (HDMI), Recommended Standard 232 (RS-232), a power line communication, and Plain Old Telephone Service (POTS). The network 162 may include a telecommunication network (e.g., at least one of a computer network (e.g., LAN or WAN), the internet, and a telephone network).

Each of the first and second external electronic devices 102 and 104 may be the same type as or different from the electronic device 101. According to various embodiments, all or some of the operations to be executed by the electronic device 101 may be executed by another electronic device or a plurality of other electronic devices (e.g., the electronic devices 102 and 104 or the server 106). According to one embodiment, in the case where the electronic device 101 should perform a certain function or service automatically or by a request, the electronic device 101 may request some functions or services that are associated therewith from the other electronic devices (e.g., the electronic devices 102 and 104 or the server 106), instead of, or in addition to, executing the functions or service by itself. The other electronic devices (e.g., the electronic devices 102 and 104 or the server 106) may execute the requested functions or additional functions, and may deliver the results to the electronic device 101. The electronic device 101 may provide the requested functions or services by processing the received results as they are or additionally. For this purpose, for example, a cloud computing technique, a distributed computing technique, or a client-server computing technique may be used.

Figure 2A:
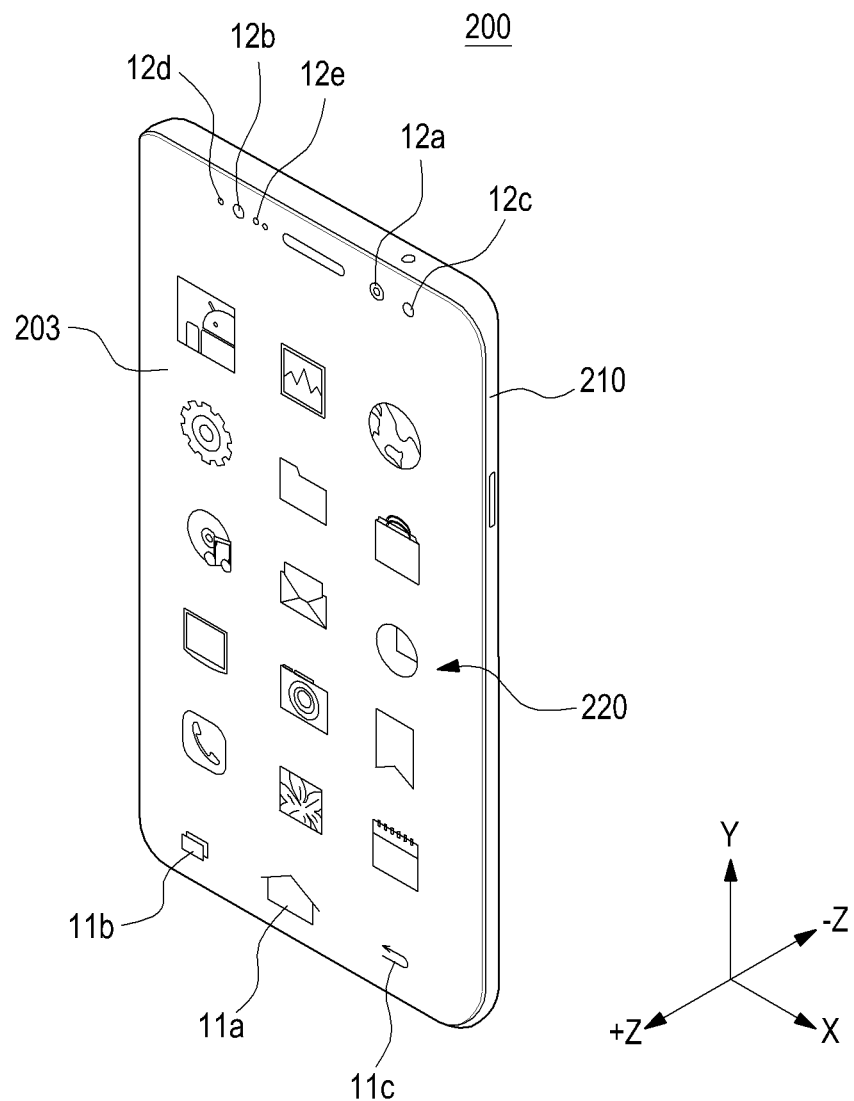
FIG. 2A is a perspective view illustrating an electronic device 200 according to one of various embodiments.
Figure 2B:
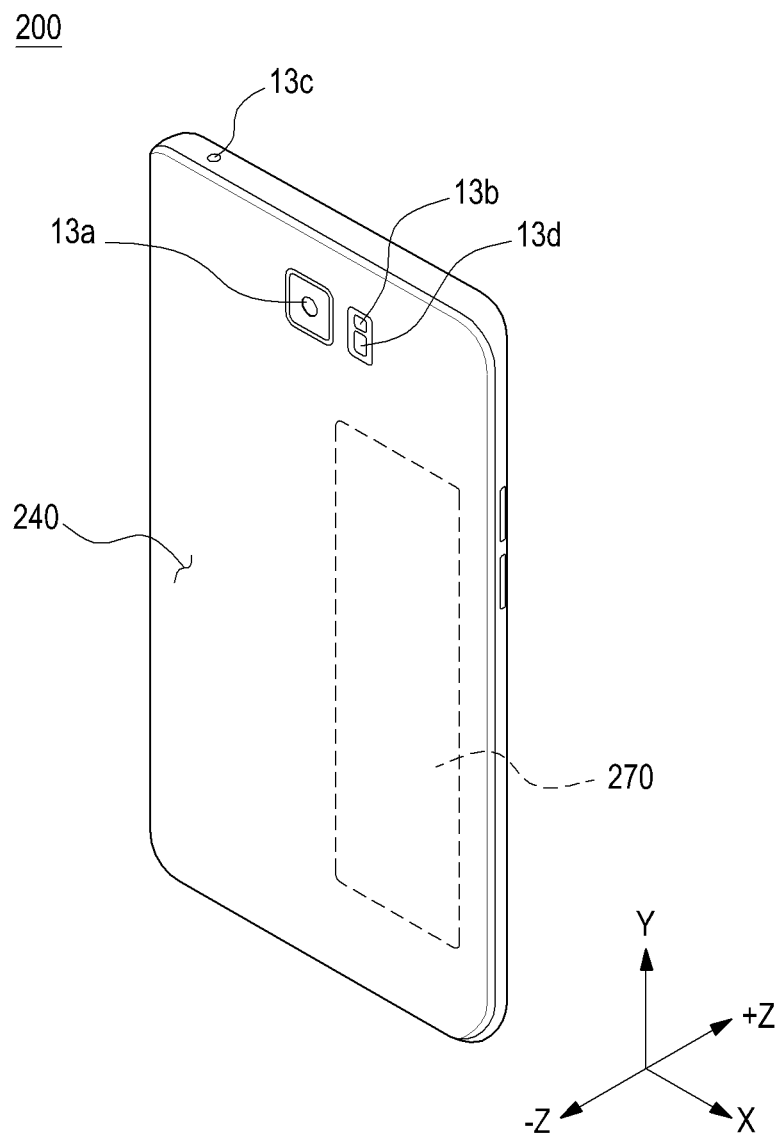
FIG. 2B is a perspective view illustrating the electronic device 200 according to one of various embodiments, which is viewed in another direction.

FIG. 2A is a perspective view illustrating an electronic device 200 according to one of various embodiments. FIG. 2B is a perspective view illustrating the electronic device 200 according to one of various embodiments, which is viewed in another direction;

The electronic device 200 illustrated in FIGS. 2A and 2B may be an electronic device which is at least partially or entirely the same as the electronic device of FIG. 1 (e.g., the electronic device 101).

In FIGS. 2A and 2B, an "X-axis" in an orthogonal coordinate system of three axes may correspond to the width direction of the electronic device 200, a "Y-axis" may correspond to the length direction of the electronic device 200, a "Z-axis" may correspond to the thickness direction of the electronic device 200. The "first (+Z) direction" used for describing various embodiments may mean a direction perpendicular to one face of a transparent plate 203, and the "second (−Z) direction" may mean a direction opposite the "first (+Z) direction."

According to various embodiments, the electronic device 200 may include a housing 210 and a display device 220. The housing 210 may include a side face perpendicular to the first (+Z) direction and a rear face 240 facing in the second (−Z) direction opposite the first (+Z) direction. The housing 201 may have an open front face, which faces in the first (+Z) direction, and a transparent cover 203 may close the open front face of the housing 210. For example, the region facing in the first (+Z) direction in the housing 210 may be substantially covered by the transparent cover 203, and the housing 210 may cover the side face and/or the rear face. As another example, one face facing in the first (+Z) direction in the housing 210 may be partially formed in an edge region of the transparent cover 203.

The electronic device 200 may be provided with a keypad including buttons or touch keys 11a, 11b, and 11c that mechanically operate on one side region of the transparent cover 203, for example. The touch keys 11a, 11b, and 11c may generate input signals by a user's body contact. According to various embodiments, the keypad may be implemented with only the mechanical buttons, or with only the touch keys. As another example, the keypad may be implemented as a combination form of a mechanical button type and a touch type. In addition, the keypad may provide various images that are expressed on the display device corresponding to the length of time for which the buttons are touched or pressed long or short.

According to various embodiments, the housing 210 is configured to accommodate various electronic components and the like, and at least a part of the housing 110 may be made of a conductive material. For example, the housing 210 may include sidewalls that form the external faces of the electronic device 200, and the externally exposed portions of the electronic device 200 may be made of a conductive metal. A PCB (not illustrated) and/or a battery 270 may be accommodated in the housing 210.

According to various embodiments, at least one of terminal circuits, for example, an Application Processor (AP), a Communication Processor (CP), a memory, and an RF transceiver, may be mounted on the PCB, which may include a signal line (e.g., an RF signal line). For example, a processor, a communication module, various interfaces (e.g., the interfaces 150 and 170 in FIG. 1), a power management module, etc. may be mounted on the PCB (not illustrated) in the form of integrated circuit chips. As another example, a control circuit may also be configured as an integrated circuit chip and may be mounted on the PCB. For example, the control circuit may be a portion of the above-described processor or communication module. Power can be secured by housing the battery 270 in the housing 210.

According to various embodiments, a first camera 12a, a light source unit 12b, or an iris camera 12c may be included in the upper end region of the transparent cover 203 of the electronic device 200. For example, the light source unit 12b may be an IR LED, and the iris camera 12c may recognize iris information by imaging the user's eyes using red near-infrared rays emitted from the IR LED as a light source. In another example, the electronic device 200 may include a light source unit indicating lamp 12d and an illuminance sensor or a proximity sensor 12e in the upper end region of the front face thereof. In another example, the electronic device 200 may include, on the rear face 240 thereof, a second camera 13a, a Heart Rate Monitor (HRM) 13d, or a flash 13b, and may include a microphone 13c in the upper portion thereof.

According to various embodiments, the display device 220 may be exposed through the transparent cover 203. The display device 220 may be at least partially made of a material that transmits radio waves or magnetic fields, and may be mounted between the housing 210 and the window cover 203 so as to face in the first (+Z) direction. The display device 220 may include a display panel mounted on an inner face of a transparent cover 203, which is made of a tempered glass material. A touch panel may be mounted between the transparent cover 203 and the display panel. For example, the display device 220 may be an output device for outputting a screen, and may be used as an input device equipped with a touch screen function.

According to one embodiment, the display device 220 may include a dielectric layer and an optical layer. The dielectric layer may be disposed to be in contact with the transparent cover 203 and may include, for example, silicon, air, foam, a membrane, an Optical Clear Adhesive (OCA), rubber, sponge, ink, or a polymer (PC or PET). The optical layer may be disposed on the rear face of the dielectric layer.

According to various embodiments, the electronic device 200 may include a rear cover 240 that protects the rear face of the housing 210. The rear cover 240 may be installed to face in a direction (second (−Z) direction) opposite the display device 220, and may be made of a material capable of transmitting radio waves or magnetic fields (e.g., tempered glass or a synthetic resin). The rear cover 240 may form the external appearance of the electronic device 200 together with the housing 210 and the display device 220.

Although not illustrated in detail in the drawings, according to various embodiments, various structures may be formed on the inner surfaces of the housing 210 according to the arrangement of the electronic components disposed inside the electronic device 200 or the binding structures between the housing 210 and an inner electronic component. For example, a space may be formed in the housing 210 so as to accommodate integrated circuit chips mounted on the PCB. The space for accommodating integrated circuit chips may be formed of in the form of a recess or may be formed by a rib or the like that surrounds the integrated circuit chips.

Hereinbelow, descriptions will be made of the display device 220 provided in the electronic device 200 according to various embodiments.

Figure 3A:
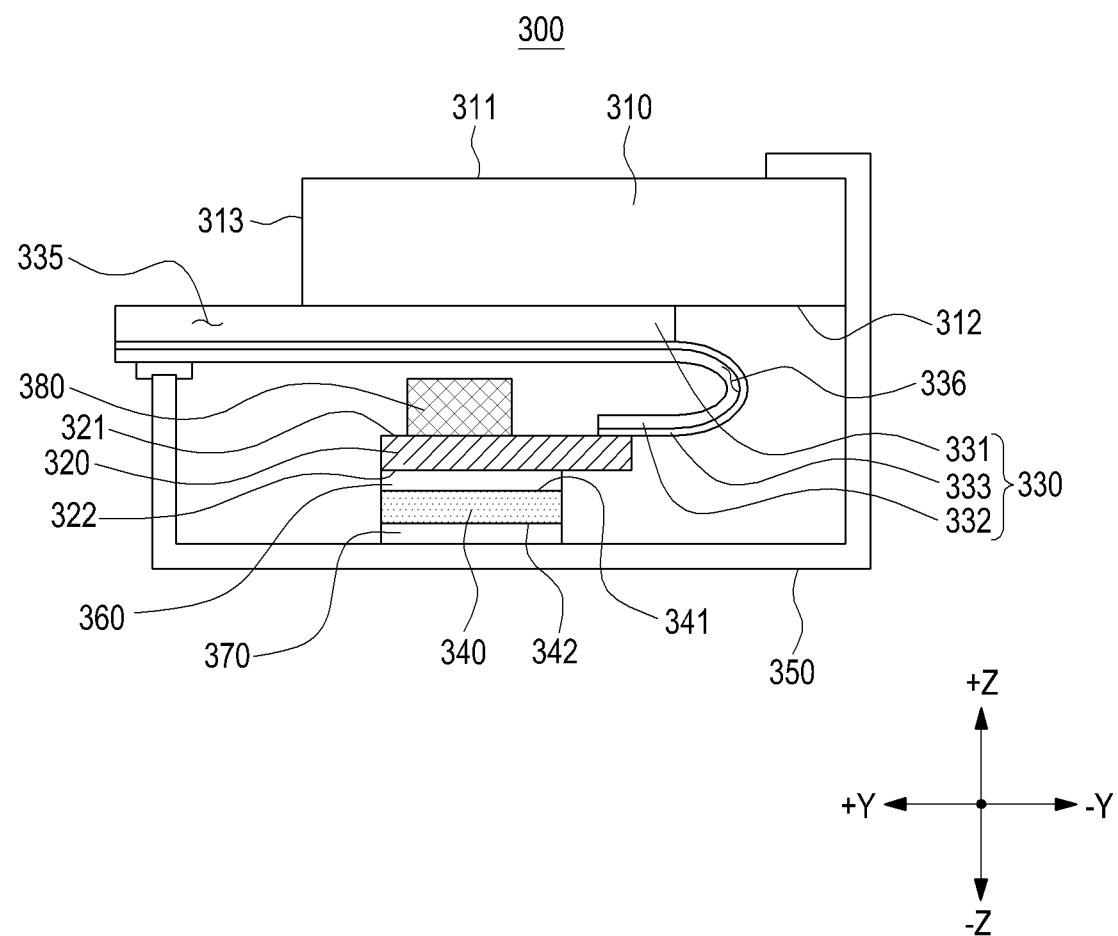
Figure 3B:
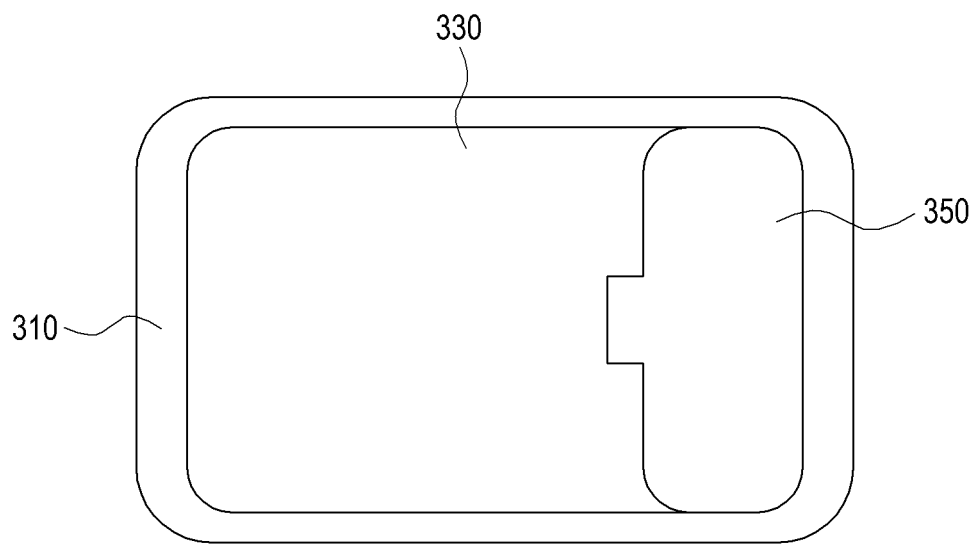
Figure 3C:
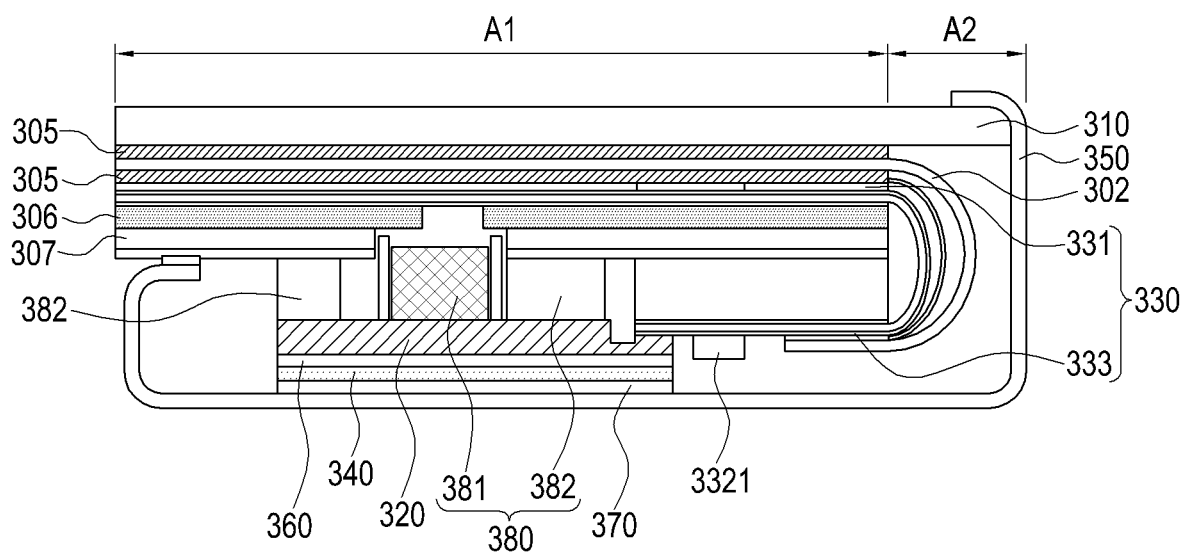

FIGS. 3A to 3C are views illustrating a device 300 including a display device and a polymer layer, according to one of various embodiments, in which FIG. 3A is a view simply illustrating a cross section of the device 300, FIG. 3B is a plan view in which the device is viewed in a second (−Z) direction in FIG. 3A, and FIG. 3C is a cross-sectional view illustrating FIG. 3A in detail.

The structure of the display device of FIGS. 3A to 3C may be partially or entirely the same as the structure of the display device 220 of FIG. 2.

Referring to FIGS. 3A to 3C, a device 300 may include a glass plate 310, a display device 320 and 330, a polymer layer 340, and a cover structure 350. The display device 320 and 330 may include a flexible PCB 320, a flexible display layer 330, a dielectric layer 305, an optical layer 302, etc.

According to various embodiments, the glass plate 310 may include a first face 311 facing in the first (+Z) direction, a second face 312 facing in the second (−Z) direction opposite the first (+Z) direction, and a side face 313 facing in a third (+Y, −Y) direction perpendicular to the first direction (+Z). The glass plate 310 may include an active region A1 that practically provides images and/or moving images to the user and an inactive region A2 extending from the active region A1 to the edge of the glass plate 310. The display device 320 and 330 may be disposed in a flat state under the active region A1 of the glass plate 310, and the display device 320 and 330 may be disposed in a bent state under the inactive region A2.

According to various embodiments, the display device 320 and 330 may be exposed to the front face through the glass plate 310 (e.g., the window cover 203 in FIG. 2), and may include the display layer 330 and the flexible PCB 320. The flexible PCB 320 may have a control circuit configured to send control signals to the display layer 330. The display layer 330 (e.g., an organic light-emitting display device) may be disposed to form a display element layer 331 having a plurality of signal lines and a plurality of pixels and a lower plate of the display layer 330, and may include a support board 332 (e.g., polyimide (PI)), on which a display wiring layer 333 is formed. The wiring layer 333, in which wiring lines are formed, may be connected to the PCB 320, on which the control circuit is formed.

According to various embodiments, an optical member and/or a touch sensor panel 302 may be mounted between the glass plate 310 and the display element layer 331 or inside the display element layer 331 according to various embodiments. For example, the display device 320 and 330 may be an output device configured to output a screen, and may be used as an input device equipped with a touch screen function. As another example, a dielectric layer 305 may be disposed between the display element layer 331 and/or the touch panel 302, and the display element layer 331 may have an emboss member 306, a cushion member 307, or the like disposed on the bottom face thereof.

According to various embodiments, the display layer 330 may include a flat portion 335 disposed between the second face 312 of the glass plate 310 and the first face 321 of the flexible PCB 320, and a bent portion 336 extending from the flat portion 335 and bent to be connected to the flexible PCB 320. The display element layer 331 may be positioned on the flat portion 335 and the wiring layer 333 and the support board 332 may be positioned on the bent portion 336 and the flat portion 335.

The display element layer 331 may include a substrate (not illustrated) and a sealing member (not illustrated) covering and protecting the plurality of pixels formed on the substrate. The substrate may be formed of a transparent insulating substrate such as glass or a polymer film, and may include a flexible substrate when the substrate is formed of a polymer film. The sealing member may include glass, a polymer film, or a metal. As another example, the sealing member may include a thin film sealing layer in which a plurality of organic films and a plurality of inorganic films are alternately repeatedly laminated at least once. The sealing member may seal a plurality of pixels PE so as to protect the plurality of pixels PE from foreign substances (e.g., moisture and/or oxygen).

According to various embodiments, the wiring layer 333 formed on the support board 332 of the display layer may extend via the flat portion 335 and bent through the bent portion 336 so as to be disposed on the flexible PCB 320. A Display IC (D-IC) 3321 and/or a Touch Sensor Panel IC (TSP-IC) may be disposed on the face facing in the second (−Z) direction in the wiring layer 333. The wiring layer 333 may include a chip-on-film or a tape carrier package having a flexible printed circuit film or a drive chip.

According to various embodiments, the PCB 320 may include a first face 321 facing the second face 312 of the glass plate 310 in the first (+Z) direction and a second face 322 facing in the second (−Z) direction. The PCB 320 may include a plurality of electronic components mounted thereon and a Flexible Printed Circuit Board (FPCB). A polymer layer 340 may be stacked on one face of the flexible PCB 320.

According to various embodiments, the polymer layer 340 may be disposed to overlap at least a portion of the flexible PCB 320, and the overlap region may include at least one suction region such that a suction pad of a suction device (not illustrated) comes into contact with the suction region.

Figure 9:
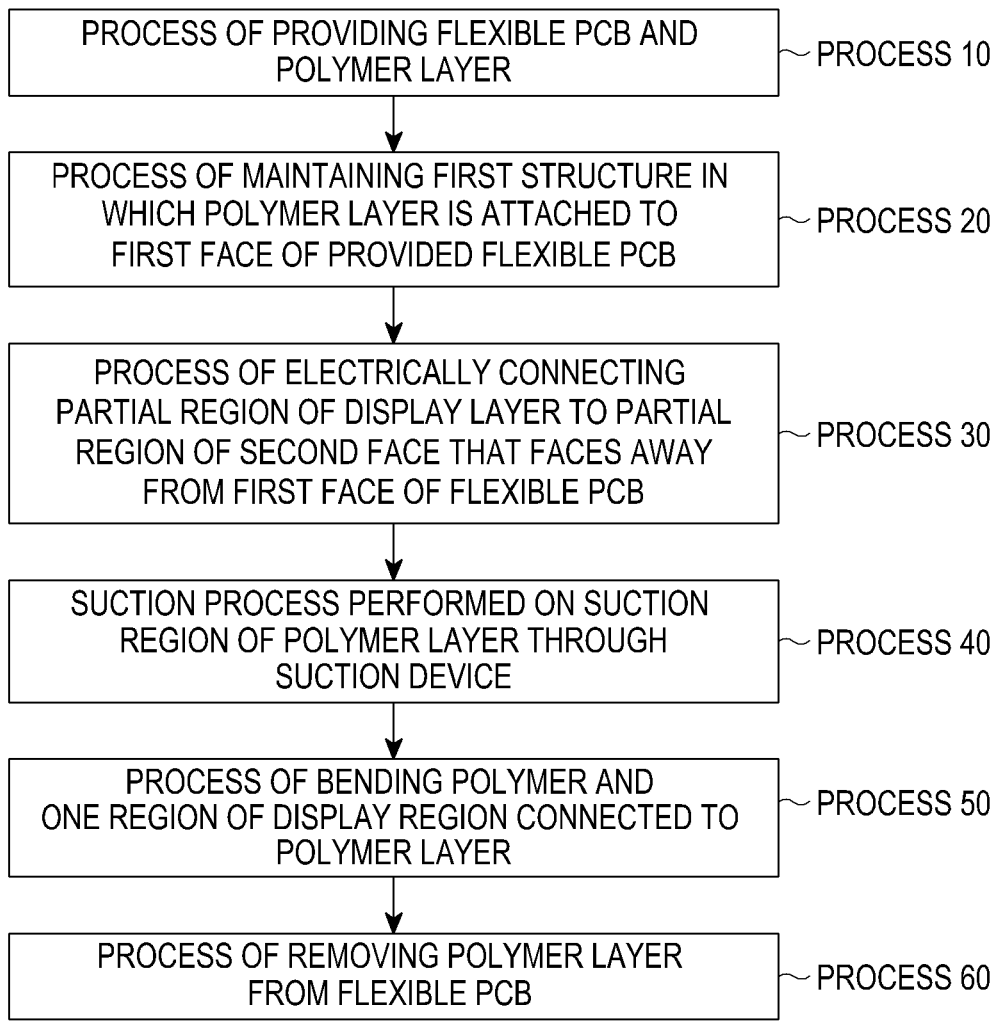
FIG. 9 is a flowchart sequentially illustrating a method of manufacturing a display using a polymer layer, according to various embodiments.

According to various embodiments, the polymer layer 340 may be provided to maintain the flatness of the polymer layer 340 and/or to prevent the polymer layer 340 from being released from the PCB 320 (e.g., to secure a fixing force) during a bending process including a vacuum suction process of the display layer 330 (e.g., processes 40 and 50 in FIG. 9). After the bending process is completed, the polymer layer 340 may be removed together with the cover structure 350 or independently.

According to various embodiments, the polymer layer 340 may include a first face 341 facing in the first (+Z) direction and attached to the second face 322 of the flexible PCB 320 and a second face 342 facing in the second (−Z) direction. The polymer layer 340 may include any one material or a combination of two or more materials selected from a group consisting of polyethylene terephthalate (PET), boron nitride (BN), graphine, carbon nanotube (CNT), graphite, polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (DCPD), cyclopentadiene anions (CPD), polyarylate (PAR), polyethersulfone (PES), polyether imide (PEI), modified epoxy resins, and an acrylic resin. Details of various structures and physical properties of the polymer layer 340 will be described later.

According to various embodiments, the first face 341 and/or the second face 342 of the polymer layer 340 may include one or more adhesive layers 360 and 370. For example, a first adhesive layer 360 may be disposed between the second face 322 of the flexible PCB 320 and the first face 341 of the polymer layer 340. As another example, a second adhesive layer 370 may be disposed between the second face 342 of the polymer layer 340 and the cover structure 350.

According to various embodiments, the cover structure 350 may be disposed to enclose at least a part of the flexible PCB 320, the flexible display layer 330, and the polymer layer 340. A partial region of the cover structure 350 may be connected to the glass plate 310 and the polymer layer 340. As another example, another region of the cover structure 350 may be connected to the bottom face of the flexible display layer 330, which faces in the second (−Z) direction. According to the arrangement, the cover structure 350 may cover some partial regions (e.g., the display element layer 331, the wiring layer 333, and the flexible PCB 320) and the flexible PCB 320 of the display device 320 and 330, on which a bending process (e.g., process 50 in FIG. 9) has been performed, so as to prevent (or reduce the likelihood of) the partial regions from being damaged by an external impact.

According to various embodiments, on a part of the inner face of the cover structure 350, which faces in the first (+Z) direction, a second adhesive layer 370 attached to the polymer layer 340 may be disposed. The second adhesive layer 370 and the polymer layer 340 may be removed together in the process of removing the cover structure 350. For example, the second adhesive layer 370 disposed between the cover structure 350 and the polymer layer 340 may include a material having an adhesive force stronger than that of the first adhesive layer 360 disposed between the polymer layer 340 and the flexible PCB 320. When the cover structure 350 is removed, the polymer layer 340 attached to the second adhesive layer 370 having the stronger force can be removed together with the cover structure 350.

According to various embodiments, the flexible PCB 320 and one or more sensors 380 may be disposed in the second (−Z) direction of the display layer. The one or more sensors 380 may be a pressure sensor 381 and/or a fingerprint sensor 382, which may be disposed on the single flexible PCB 320. As another example, the pressure sensor 381 and the fingerprint sensor 382 may be separately disposed on different PCBs, respectively.

Figure 4:
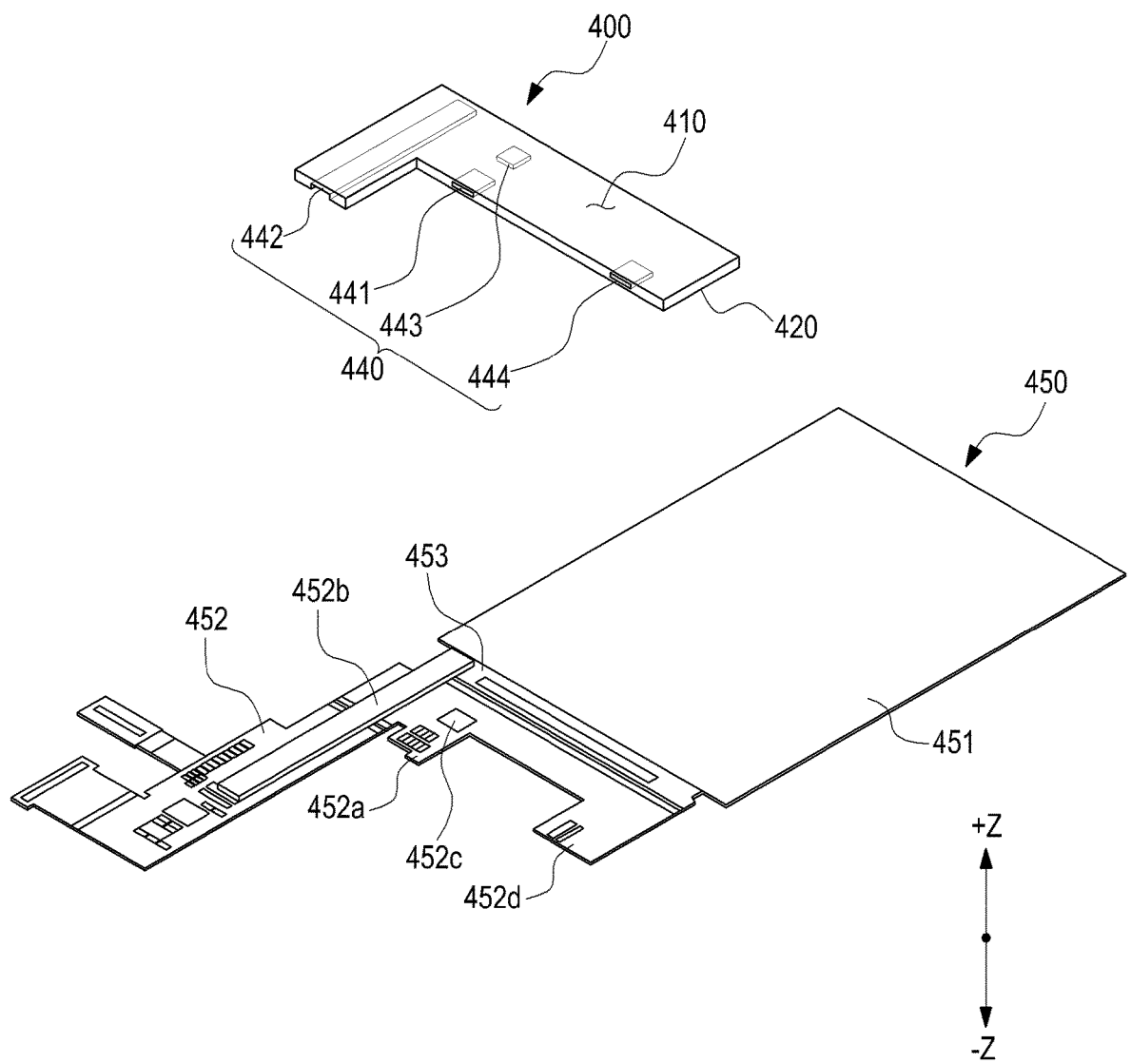
FIG. 4 is a perspective view illustrating a display device 450 and a polymer layer 400 prior to a bending process, according to one of various embodiments.

FIG. 4 is a perspective view illustrating a display device 450 and a polymer layer 400 prior to a bending process, according to one of various embodiments.

The structures of the display device 450 and the polymer layer 400 of FIG. 4 may be partially or entirely the same as the structures of the display devices 320 and 330 and the polymer layer 340 of FIG. 3. For the convenience of description, in FIG. 4, unlike FIG. 3, a face of the flexible PCB 452 or the polymer layer 400, which faces in the first (+Z) direction, is defined as a first face, and a face, which faces in the second (−Z) direction, is defined as a second face.

Referring to FIG. 4, the device may include a display device 450 and a polymer layer 400. The display device 450 may include a display element layer 451 having a plurality of signal lines and a plurality of pixels, a PCB 452 having a control circuit configured to send control signals to the display element layer 451, and a wiring layer 453 disposed on a support board connecting the display element layer 451 and the PCB 452 to each other.

According to various embodiments, a polymer layer 400 may be disposed on the first face of the PCB 452, which faces in the first (+Z) direction. The polymer layer 400 may be fabricated in a structure that is attachable or detachable depending on a process.

According to various embodiments, the polymer layer 400 may include a resin layer having a thermally reactive property. The polymer layer 400 may include an adhesive layer (e.g., a thermally reactive adhesive tape) the adhesive force of which is variable under certain conditions (e.g., temperature), and may provide an adhesive force, which is variable depending on different temperature environments in a display device bending process (e.g., process 50 in FIG. 9) and a polymer layer 400 removal process (e.g., process 60 in FIG. 9).

For example, the polymer layer 400 is capable of maintaining a predetermined adhesive force in a region that is in contact with the PCB 452 in order to maintain flatness of the polymer layer 400 and/or to prevent the polymer layer 400 from being released from the PCB 452 (e.g., to secure a fixing force) during the bending process including a vacuum suction process (e.g., processes 40 and 50 in FIG. 9). As another example, in the process of removing the polymer film (e.g., process 60 in FIG. 9) after completing the bending process, the polymer layer 400 may provide an adhesive force which is variable in order to minimize the damage of the PCB 452 attached thereto, so that the polymer layer 400 can be removed from the PCB 452.

According to various embodiments, the polymer layer 400 may be fabricated to include an adhesive component. For example, the polymer layer 400 may include an inorganic material having a hexagonal crystal structure. As another example, additives for fabricating the polymer layer 400 may include polyethylene terephthalate (PET), boron nitride (BN), graphine, carbon nano-tube (CNT), graphite, or other additives. Among the above-mentioned additives, a single material or a combination of two or more materials may be used.

Table 1 below shows the adhesive forces of the polymer layer 400 depending on temperature conditions in comparison.

TABLE 1

| Condition (e.g., left for 5 minutes) | Adhesive force (gf/in) |
|---|---|
| Room temperature (24° C.) | 1800 |
| 50° C. | 1000 |
| 80° C. | 500 |

Referring to Table 1, it can be seen that the adhesive force of the polymer layer 400 gradually decreases as the temperature increases. The adhesive force of the polymer layer 400 may vary from about 200 gf/in to about 2000 gf/in depending on the temperature change. For example, it can be seen that the polymer layer 400 exhibits an adhesive force of about 1800 gf/in at room temperature (e.g., 24° C.), exhibits an adhesive force of about 1000 gf/in at about 50° C., and exhibits an adhesive force of about 500 gf/in at about 80° C.

In the bending process (e.g., process 50 in FIG. 9) according to various embodiments, the polymer layer 400 may be subjected to the process at room temperature in order to maintain the strong adhesive force with the PCB 452. Then, the polymer layer 400 may be removed from the PCB 452 at a high temperature of 50 degrees or higher, in the polymer film removal process (e.g., process 60 in FIG. 9).

The structure of the polymer layer 400 will be described with reference to FIG. 4 again. The polymer layer 400 may be formed of an adhesive material so as to be attachable to or detachable from the one face of the PCB 452. The polymer layer 400 may be formed in a shape corresponding to a portion of the first face of the PCB 320. For example, the polymer layer 400 may be formed to have a "]" shape so as to substantially cover one face of the PCB 452, which also has the "]" shape.

According to various embodiments, the polymer layer 400 may include a first face 410 that faces in the first (+Z) direction and a second face 420 that faces in the second (−Z) direction opposite the first (+Z) direction. The first face 410 may include a suction region including at least one suction portion. The second face 420 may be attached to the PCB 452 and may have a recess 440 configured to accommodate one or more electronic components mounted on the PCB 452.

According to various embodiments, the recess 440 formed in the second face 420 may be formed in a groove, an opening, or a stepped shape. Various electronic components may be mounted on the PCB 452, and, for example, the electronic components may include a sensor, a passive element, an IC chip, or a part of a flexible circuit board. A passive element may be disposed in a first region 452a of the PCB 452 and a Touch Screen Panel PCB (TSP PCB) may be disposed in a second region 452b. As another example, an IC chip may be disposed in a third region 452c of the PCB 452, and a connector may be disposed in a fourth region 452d.

According to various embodiments, the second face 420 of the polymer layer 400 may have a recess 440 formed in a region corresponding to any one of the first to fourth regions 452a, 452b, 452c, and 452d in order to accommodate the electronic components. For example, the polymer layer 400 may have a groove 441 formed in a contact face corresponding to the first region 452a and having a shape corresponding to that of the passive element, so that when the polymer layer 400 is stacked on the PCB 452, the passive element can be accommodated in the groove. The first face 410 of the polymer layer 400 is able to maintain a flat face regardless of the recess formed in the second face 420.

As another example, the polymer layer 400 may have a groove-shaped line 442 which is disposed in the second region 452b and corresponds to the shape of a part of the PCB of the touch screen panel, so that, when the polymer layer 400 is stacked on the PCB 452, the PCB of the touch screen panel can be accommodated inside the groove-shaped line 442. The line formed in the second region 452b may form a passage through which the PCB 452 of the touch screen panel, and the first face 410 of the polymer layer 400 is able to maintain a flat face regardless of the groove formed in the second face 420.

As another example, the polymer layer 400 may have a groove 443 which is disposed in the third region 452c and corresponds to the shape of the IC chip, so that, when the polymer layer 400 is stacked on the PCB 452, the IC chip can be accommodated inside the groove 443. The first face 410 of the polymer layer 400 is able to maintain a flat face regardless of the groove 443 formed in the second face 420.

As another example, the polymer layer 400 may have a groove 444 which is disposed in the fourth region 452d and corresponds to the shape of the connector, so that, when the polymer layer 400 is stacked on the PCB 452, the connector can be accommodated inside the groove 444. The first face 410 of the polymer layer 400 is able to maintain a flat face regardless of the groove 444 formed in the second face 420.

According to an embodiment, through a groove structure 440 formed to correspond to the first to fourth regions 452a, 452b, 452c, and 452d of the polymer layer 400, the first face 410, which is opposite the second face 420, may be utilized as a suction region. However, the grooves formed in the polymer layer 400 are not limited to the first to fourth regions 452a, 452b, 452c, and 452d. In order to extend the first face 410 on which the suction region is formed, it can be further designed in the region in which electronic components are disposed.

Figure 5A:
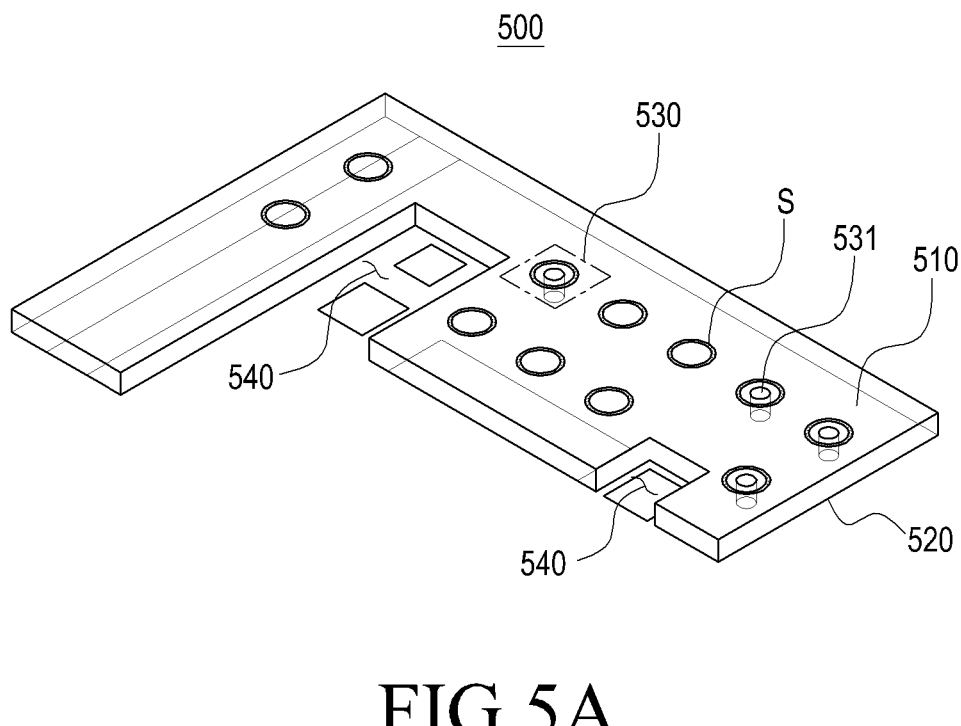
FIG. 5A is a perspective view illustrating a suction structure provided on the polymer layer 500 according to various embodiments.
Figure 5B:
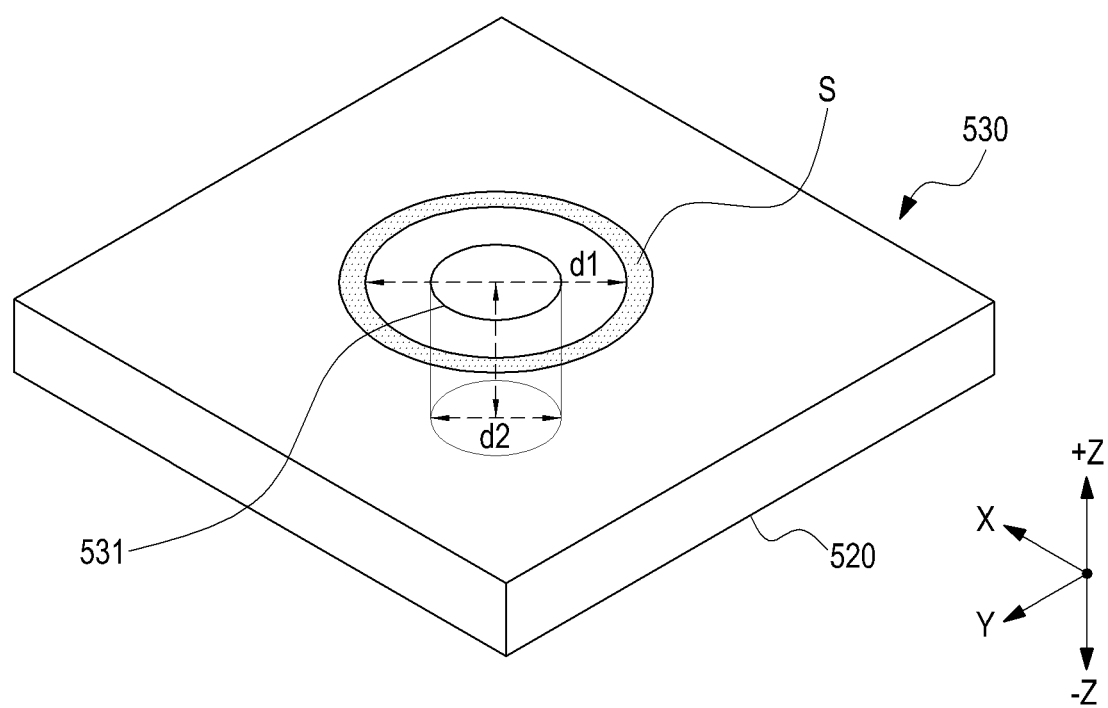
FIG. 5B is an enlarged perspective view illustrating a partial region 530 of the suction structure of FIG. 5A in an enlarged scale.

FIG. 5A is a perspective view illustrating a suction structure provided on the polymer layer 500 according to various embodiments, and FIG. 5B is an enlarged perspective view illustrating a partial region 530 of the suction structure of FIG. 5A in an enlarged scale.

The polymer layer 500 of FIGS. 5A and 5B may be partially or entirely the same as the structure of the polymer layer 400 of FIG. 4.

Referring to FIGS. 5A and 5B, the polymer layer 500 is fabricated to include an adhesive material attachable to or detachable from one face of a PCB (e.g., the PCB 452 of FIG. 4). The polymer layer 500 may be formed in a shape corresponding to at least a portion of the shape of the PCB 452.

According to various embodiments, the polymer layer 500 may include at least one opening 540 such that a region of the PCB 452 in which an electronic component is disposed is exposed to the outside. The opening 540 may be formed in a shape corresponding to the shape of the electronic component and the polymer layer 500 may be made thicker than the thickness of the electronic component in order to prevent (or reduce the likelihood of) the electronic component from being in contact with the suction structure.

According to various embodiments, the polymer layer 500 may include a suction region 530 that is in contact with a suction device (not illustrated), and the suction region 530 is maintained in the suctioned state by the suction device in the suction process. For example, the suction device may include a plurality of suction pads to be in contact with and to suction the suction region 530 of the polymer layer 500, and the suction process for suctioning a mixture gas, air, or the like may be performed on the suction pads. Through the suction process, a space including the suction region 530 of the polymer layer 500 and the suction pad of the suction device can be maintained in a vacuum state. Referring to FIGS. 5A and 5B, a virtual suction pad region of the suction device, which is to be in contact with the suction region 530 of the polymer layer 500 is indicated by "S."

According to various embodiments, the suction region 530 of the polymer layer 500 may include at least one hole 531. The at least one hole 531 may be formed to enhance the vacuum suction force. The at least one hole 531 may be formed to have a smaller size than the suction pad. For example, when the virtual suction pad region S is formed in a circular shape, the at least one hole 531 of the suction region 530 may be formed to have a diameter d2 smaller than the diameter d1 of the suction pad. As another example, a plurality of holes 531 may be formed in a region of the polymer layer 500, which corresponds to a plurality of suction pads.

According to various embodiments, the at least one hole 531 may be formed to penetrate the first face 510 and the second face 520 of the polymer layer 500. As another example, the at least one hole 531 may be formed in the first face 510 of the polymer layer 500 to have a predetermined depth and not to penetrate the second face 520.

According to various embodiments, the suction pads and/or holes 531 of the polymer layer 500 may be disposed in one or more rows. When the holes 531 are arranged in a single row, the holes may be arranged to be parallel to the center of the polymer layer so as to maintain the flatness of the polymer layer 500. As another example, the suction pads and/or holes 531 of the polymer layer 500 may be arranged in two rows. For example, one row of the holes 531 may be arranged along the longitudinal direction of the polymer layer 500, and another row may be arranged along the longitudinal direction of the polymer layer 500 to correspond to and to be parallel to the one row. The arrangement of the holes 531 arranged to correspond to each other with respect to the center of the polymer layer 500 is able to suppress the occurrence of partial flexure of the polymer layer 500 during the bending process, and is able to minimize process failure (e.g., cracks due to twisting, etc.). However, the rows of the holes 531 arranged in the polymer layer 500 are not limited to two rows, and various design modifications can be made in such a manner that the holes are variously arranged in one or more rows in order to ensure that the polymer layer 500 can be bent in a generally flat state.

According to various embodiments, the polymer layer 500 may be configured to keep the suction region 530, which is in contact with the suction pad of the suction device (not illustrated), flat. For example, the polymer layer 500 having a plurality of holes formed therein may be subjected to a bending process while changing the suction force such that the polymer layer 500 can be bent in a generally flat state.

According to various embodiments, the second face 520 of the polymer layer 500 may be disposed to face in the second (−Z) direction so as to face the PCB (e.g., the PCB 452 of FIG. 4) and the first face 510 may be disposed to face in the first (+Z) direction, which is opposite the second face 520. The first face 510 may include at least one suction region 530, which may be suctioned by the suction device (not illustrated). The first face 510 suctioned to the suction device may have a suction force capable of practically rotating the entire polymer layer 500 and may have a structure for enhancing the vacuum suction force based on the following equation.

Vacuum Suction Force∝Suction Region & Vacuum Degree    Equation 1

As another example, in the case of the region where the vacuum suction force is strengthened based on the following equation, a relatively small number of suction pads of the suction device are arranged compared to the number of the other suction regions 530, so that it is possible to maintain the flatness evenly by a suction force per unit area and the vacuum suction.

Vacuum Suction Force per Unit Area=Number of Suction Pads per Unit Area ($n$)*Vacuum Suction Force    Equation 2

Figure 6A:
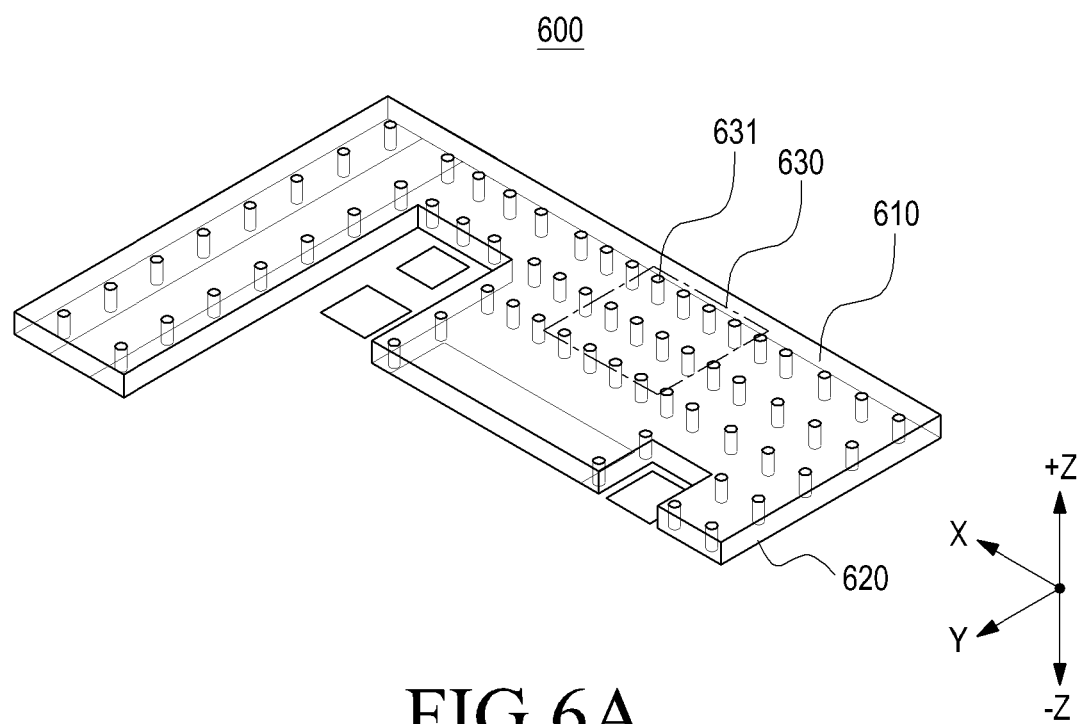
FIG. 6A is a perspective view illustrating a polymer layer 600 having a plurality of fine holes disposed therein, according to various embodiments.
Figure 6B:
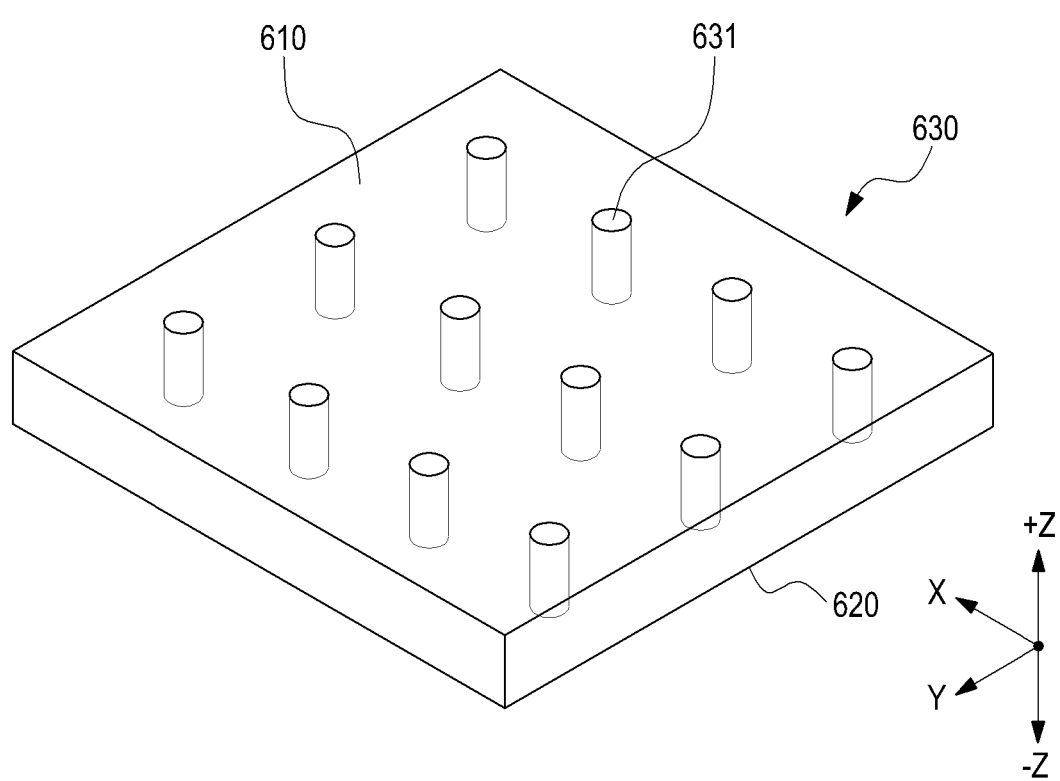
FIG. 6B is an enlarged view illustrating a partial region of the polymer layer of FIG. 6A in an enlarged scale.

FIGS. 6A and 6B are perspective views each illustrating a structure for maintaining the flatness of a polymer layer 600 according to various embodiments. FIG. 6A is a perspective view illustrating a polymer layer (600) having a plurality of fine holes disposed therein, and FIG. 6B is an enlarged view illustrating a partial region 630 of the polymer layer 600 of FIG. 6A in an enlarged scale.

The polymer layer 600 of FIGS. 6A and 6B may be partially or entirely the same as the structure of the polymer layer 400 of FIG. 4.

Referring to FIGS. 6A and 6B, the polymer layer 600 may be fabricated to include an adhesive material attachable to or detachable from one face of a PCB (e.g., the PCB 452 of FIG. 4). The polymer layer 600 may be formed in a shape corresponding to at least a portion of the shape of the PCB 452.

According to various embodiments, the polymer layer 600 may include a plurality of fine holes 631 in order to maintain the flatness thereof with the PCB. For example, the second face 620 of the polymer layer 600 is capable of being attached to the PCB depending on the above-described adhesive force, and it may be difficult for the second face 620 to maintain the flatness thereof properly due to air bubbles remaining in the second face 620 during the attachment. The flatness of the second face 620 may cause disconnection as well as deformation of the wiring layer (e.g., the wiring layer 453 of FIG. 4) in which the wiring lines are stacked at the time of performing the bending process. The plurality of fine holes 631 disposed in the polymer layer 600 is capable of discharging air bubbles remaining in the second face 620 to the outside, so that the flatness of the polymer layer 600, which is in contact with the PCB, can be maintained.

According to various embodiments, the plurality of fine holes 631 may be disposed in the polymer layer 600 at regular intervals as a whole. For example, the plurality of fine holes 631 may be formed in a columnar shape so as to penetrate the polymer layer 600, and it is possible to maintain the flatness of the entire area of the first face 610 of the polymer layer 600, which is in contact with the PCB by maintaining respective intervals between the fine holes regularly.

According to various embodiments, the plurality of fine holes 631 may be disposed in a region other than the suction region in the polymer layer 600 so as not to affect the suction between the suction device (not illustrated) and the second face 620 of the polymer layer 600.

According to various embodiments, the plurality of fine holes 631 may be disposed in the suction region of the polymer layer 600 and may be used to enhance the vacuum suction force by suction of the suction device (not illustrated).

Figure 7A:
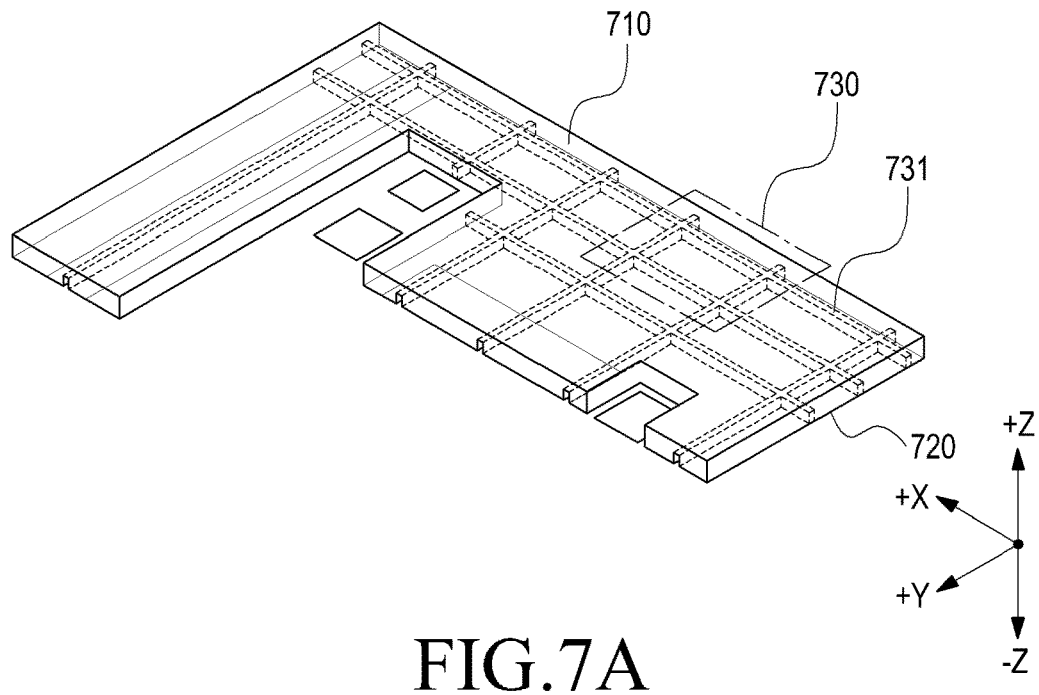
FIG. 7A is a perspective view illustrating a polymer layer 700 having a fine line structure disposed therein, according to various embodiments.
Figure 7B:
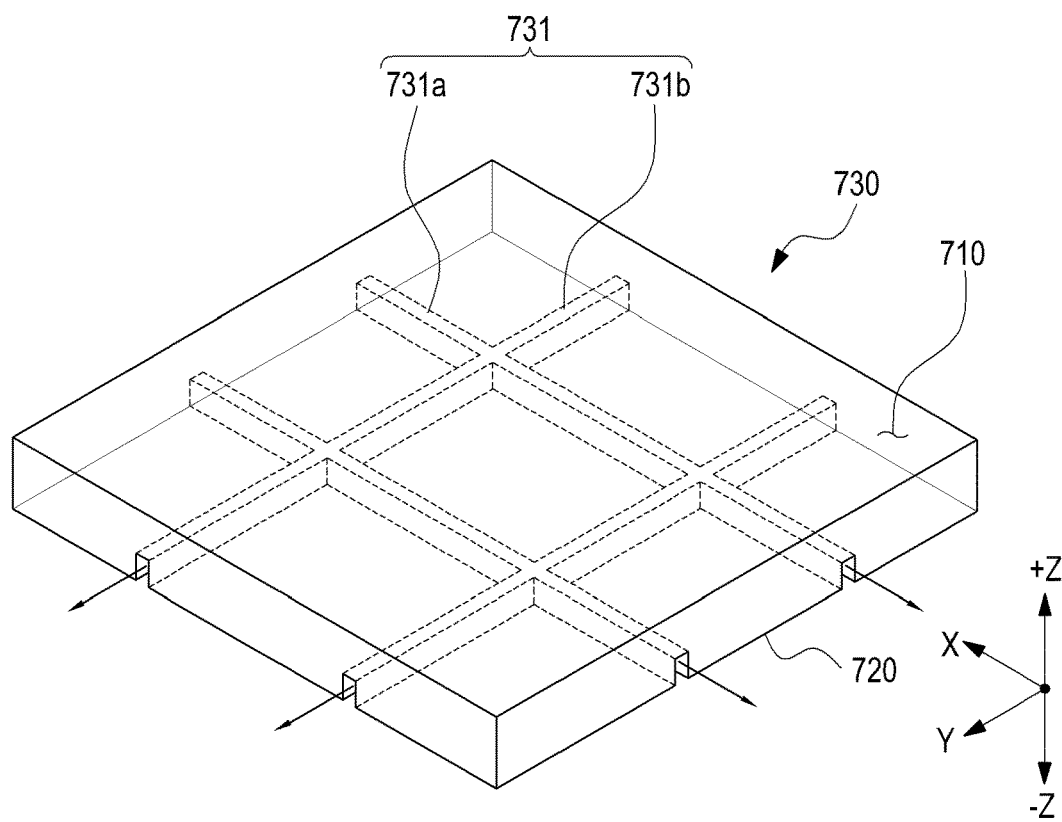
FIG. 7B is an enlarged view illustrating a partial region 730 of the polymer layer 700 of FIG. 7A in an enlarged scale.

FIGS. 7A and 7B are perspective views each illustrating a structure for maintaining the flatness of a polymer layer 700 according to various embodiments.

FIG. 7A is a perspective view illustrating the polymer layer 700 having a fine line structure disposed therein, and FIG. 7B is an enlarged view illustrating a partial region 730 of the polymer layer 700 of FIG. 7A in an enlarged scale. The polymer layer 700 of FIGS. 7A and 7B may be partially or entirely the same as the structure of the polymer layer 400 of FIG. 4.

Referring to FIGS. 7A and 7B, the polymer layer 700 may be fabricated to include an adhesive material attachable to or detachable from one face of a PCB (e.g., the PCB 452 of FIG. 4). The polymer layer 700 may be formed in a shape corresponding to at least a portion of the shape of the PCB 452.

According to various embodiments, the polymer layer 700 may include therein a groove-shaped line structure 731 in order to maintain the flatness thereof with the PCB. For example, the second face 720 of the polymer layer 700 is capable of being attached to the PCB depending on the above-described adhesive force, and it may be difficult for the second face 720 to maintain the flatness thereof properly due to air bubbles remaining in the second face 720 during the attachment. The flatness of the second face 720 may cause disconnection as well as deformation of the wiring layer (e.g., the wiring layer 453 of FIG. 4) in which the wiring lines are stacked at the time of performing the bending process. The line structure 731 disposed in the polymer layer 700 is capable of discharging air bubbles remaining in the second face 720 to the outside, so that the flatness of the polymer layer 700, which is in contact with the PCB, can be maintained.

According to various embodiments, the fine line structure 731 may be disposed on the second face 720 of the polymer layer 700 as a groove-shaped line recessed in the first (+Z) direction. For example, the line structure 731 may be formed in a groove shape extending from one end to the other end of the polymer layer 700, and air bubbles generated therein may be discharged to the outside through openings on side faces.

According to various embodiments, the fine line structure 731 may include a plurality of first line structures 731a extending in the longitudinal direction of the polymer layer 700 and a plurality of second line structures 731b arranged to be substantially perpendicular to the first line structures 731a and overlapping with the first line structures in some regions. For example, the first line structures 731a may be arranged to extend in a third (X-axis) direction, and the second line structures 731b may be arranged to extend in a fourth (Y-axis) direction substantially perpendicular to the third (X-axis) direction. As another example, respective line structures 731 (e.g., the first line structure 731a and the second line structure 731b) may be arranged in a grid form with respect to each other. As another example, the plurality of line structures 731 may be arranged at regular intervals as a whole, and the flatness of the entire area of the first face 710 of the polymer layer 700, which is in contact with the PCB, can be maintained by maintaining respective intervals of the line structures 731 regularly with respect to each other.

According to various embodiments, the plurality of line structures 731 may be disposed in a region other than the suction region in the polymer layer 700 so as not to affect the suction between the suction device (not illustrated) and the second face 720 of the polymer layer 700.

According to various embodiments, the polymer layer 400 is not limited to a structure in which a plurality of fine holes or a groove-like line structure are formed therein in order to maintain the flatness of the polymer layer 400 with the PCB, and it is possible to variously change the design of the polymer layer. For example, the design of the polymer layer 400 may be variously changed such that the second face of the polymer layer 400 may have an embossed structure including an uneven pattern.

Figure 8A:
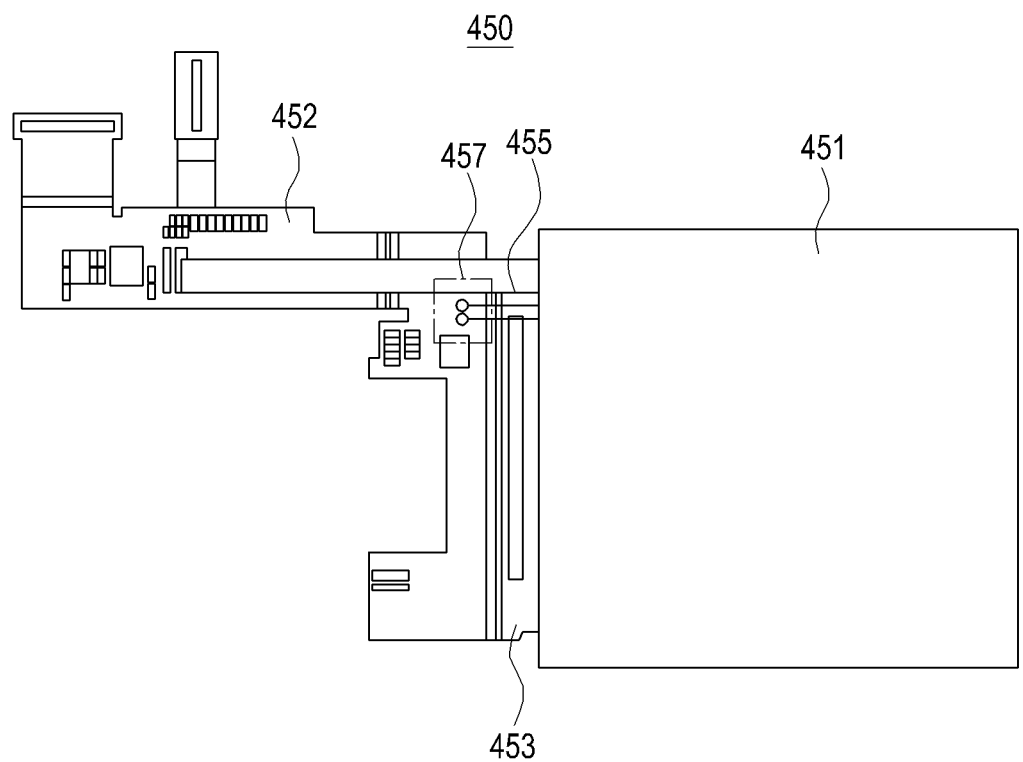
FIG. 8A is a perspective view illustrating terminals disposed on an inspection line of a PCB 452 according to various embodiments.
Figure 8B:
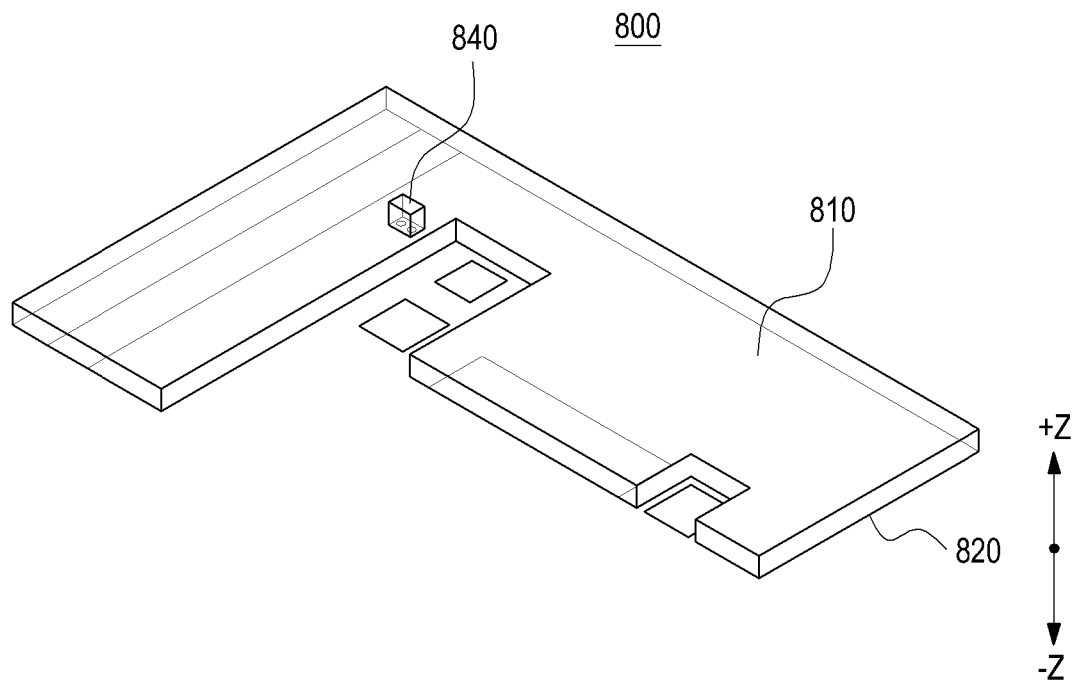
FIG. 8B is a perspective view illustrating a polymer layer 800 that may be disposed on the PCB 452 of FIG. 8A.

FIG. 8 is a perspective view illustrating a structure of a polymer layer 800 that includes a recess 840 for state inspection, according to various embodiments. FIG. 8A is a perspective view illustrating terminals disposed on an inspection line of a PCB 452, and FIG. 8B is a perspective view illustrating a polymer layer 800 that may be disposed on the PCB 452 of FIG. 8A.

The structure of the polymer layer 800 of FIGS. 8A and 8B may be partially or entirely the same as the structure of the polymer layer 400 of FIG. 4.

Referring to FIGS. 8A and 8B, the polymer layer 800 may be fabricated to include an adhesive material attachable to or detachable from one face of the PCB 452. The polymer layer 800 may be formed in a shape corresponding to at least a portion of the shape of the PCB 452.

According to various embodiments, the polymer layer 800 may include at least one recess 840 such that a region of the PCB 452 in which an electronic component is disposed is exposed to the outside. The recess 840 may be formed in a shape corresponding to the shape of the electronic component and the polymer layer 800 may be made thicker than the thickness of the electronic component in order to prevent (or reduce the likelihood of) the electronic component from being in contact with the suction structure. As another example, the recess 840 may be provided in an opening shape penetrating the polymer layer 800.

According to various embodiments, the display element layer 451 of the display may include an inspection line 455 for checking an electrical connection state with the electronic components of the PCB 452. The inspection line 455 may be electrically connected to the PCB 452 via the wiring layer 453 from the display element layer 451 and the PCB 452 may be connected to the inspection line 455 and may include one or more terminals 457. For example, the one or more terminals may be used for Anisotropic Conductive Film (ACF) bonding state inspection (e.g., good or bad determination) and may be disposed to be exposed to the outside through the recess 840 of the polymer layer 800.

According to various embodiments, the terminals formed on the PCB 452 may include a first terminal and a second terminal, and the polymer layer 800 may include a recess 840, which corresponds to the shapes of the terminals in a region where the terminals are located. By checking the inspection line, the user or the inspection device may check in real time whether or not electrical connections among the PCB 452, the wiring layer 451, and the display element layer 451 after the bending process in the state in which the polymer layer 800 is attached to the PCB 452.

In one embodiment, two terminal positions and one opening corresponding to the terminal positions are illustrated. However, the present disclosure is not limited thereto, and the design of the polymer layer 800 may be changed such that the polymer layer 800 includes a plurality of openings capable of exposing two or more terminals to the outside.

Hereinafter, a method for manufacturing a display using the polymer layer 400 will be described in detail.

FIG. 9 is a flowchart sequentially illustrating a method of manufacturing a display using a polymer layer, according to various embodiments. FIGS. 10A to 10D are simplified views illustrating a method of manufacturing a display using a polymer layer 940, according to various embodiments.

Referring to FIGS. 9 and 10, the display device (including, e.g., an organic light-emitting display) may be exposed to the front face through a glass plate (e.g., the glass plate 310 in FIG. 3A) of an electronic device. The display device may include a display element layer 910 having a plurality of signal lines and a plurality of pixels, a PCB 920 having a control circuit formed so as to send control signals to the display element layer 910, and a wiring layer 930 which is an underlayer of the display element layer 910 and to which the PCB 920 is connected.

According to various embodiments, the display element layer 910 may include a substrate (not illustrated) and a sealing member (not illustrated) covering and protecting the plurality of pixels formed on the substrate. The substrate may be formed of a transparent insulating substrate such as glass or a polymer film, and may include a flexible substrate when the substrate is formed of a polymer film. The wiring layer 930 may include a chip-on-film or a tape carrier package having a flexible printed circuit film or a drive chip. The PCB 920 may include a plurality of electronic components mounted thereon and a Flexible Printed Circuit Board (FPCB).

Figure 10A:
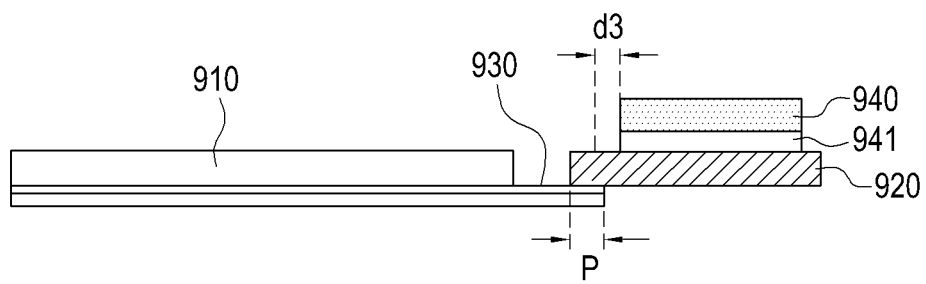
FIGS. 10A, 10B, 10C and 10D are simplified views illustrating a method of manufacturing a display using a polymer layer 940, according to various embodiments.

In a method of manufacturing the display according to various embodiments, after providing the flexible PCB 920 and the polymer layer 940 (process in FIG. 9), a process for maintaining the first structure maintaining process may be performed in which the polymer layer 940 is attached onto the first face of the provided flexible PCB 920, which faces in the first (+Z) direction (process in FIG. 9) (FIG. 10A). A first adhesive layer 941 may be provided between the polymer layer 940 and the flexible PCB 920 so as to attach the polymer layer 940 and the flexible PCB 920 to each other. The polymer layer 940 may be fabricated to include an inorganic material having a hexagonal crystal structure such that the adhesive force varies depending on a temperature condition.

According to various embodiments, the process of maintaining the first structure (process in FIG. 9) in which the polymer layer 940 is attached to the flexible PCB 920 may be performed at a room temperature such that the polymer layer 940 can maintain a strong adhesive force with the PCB 920. Since the adhesive force of the polymer layer 940 according to the temperature condition has been described above (see Table 1), the repeated description thereof is omitted.

After the polymer layer 940 is attached to the first face of the flexible PCB 920, a process in which a partial region of the display element layer 910 is attached to a partial region of the second face of the flexible PCB 920, which faces in a second (−Z) direction opposite the first face of the flexible PCB 920 (process in FIG. 9). For example, a lower partial region of the wiring layer 930, which forms the underlayer of the display element layer 910 of the display layer and has wiring lines formed therein, may be attached to the flexible PCB 920. The wiring layer 930 and the flexible PCB 920 may be electrically connected to each other. Hereinafter, the attached portion for electrical connection will be referred to as an "adhesive region P."

According to various embodiments, the adhesive region P may be a region where the polymer layer 940 is excluded. For example, the adhesive region P may be a portion in which an electrical (resistance) test through the inspection line described above (see FIGS. 8A and 8B) can be performed. As another example, the adhesive region P may be formed at a predetermined distance from the polymer layer 940, and the distance may be about 1 to 2 mm.

Figure 10B:
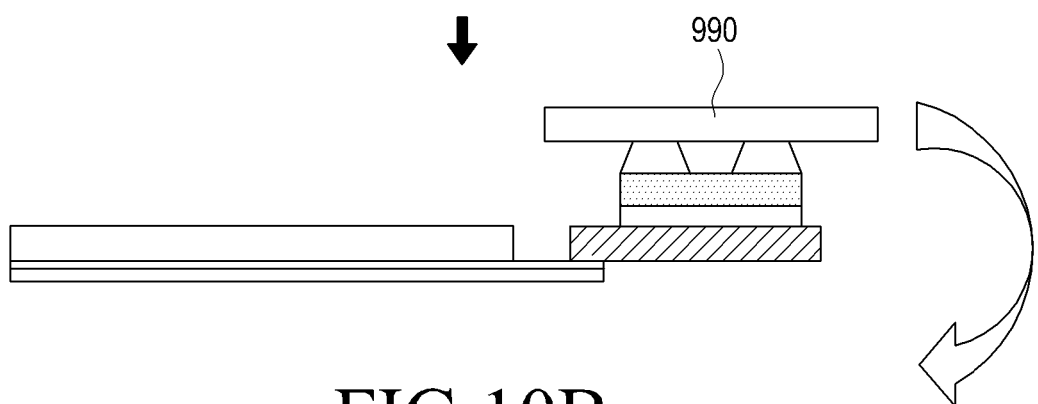

After the polymer layer 940 is attached to the adhesive region P, it is possible to perform a suction process in a partial region of one face of the polymer layer 940 through the suction device 900 (process 40 in FIG. 9) (FIG. 10B). The suction device 990 may include a suction pad for suctioning a mixed gas or air, and the suction pad may be in contact with the suction region of the polymer layer 940 to perform suction.

According to various embodiments, a plurality of suction pads may be formed in the suction device 990 at predetermined intervals, and a plurality of suction regions of the polymer layer 940 may be formed at preset intervals in the regions corresponding to the suction pads. The suction region of the polymer layer 940 may be one face of the polymer layer 940 and may be made flat such that no gap is created in a suction face that is in contact with the suction device 990. As another example, the polymer layer 940 is capable of maintaining a uniform flatness while suction is maintained.

According to various embodiments, the polymer layer 940 may be formed in a structure for enhancing the vacuum suction force, which includes at least one hole (e.g., see FIGS. 5A and 5B) in the suction region in order to enhance the vacuum suction force and to maintain the flatness. The at least one hole may have a smaller size than the suction pad.

According to various embodiments, the polymer layer 940 may include a plurality of fine holes (see, e.g., FIGS. 6A and 6B) and/or line structures (see, e.g., FIGS. 7A and 7B) in order to increase the suction force and to maintain the flatness. For example, the rear face of the polymer layer 940 is able to be attached (directly or indirectly) to the PCB 920 according to the above-described adhesive force, and it may be difficult for the rear face of the polymer layer 940 to maintain the flatness properly due to the air bubbles remaining in the rear face during the attachment. When the flatness of the rear face is not maintained, deformation, disconnection, or the like may be caused in the wiring layer 930 in which wiring lines are stacked while the bending process is performed. The plurality of fine holes and/or fine line structures disposed in the polymer layer 940 may cause the air bubbles remaining in the rear face to be discharged to the outside such that the flatness can be maintained.

Figure 10C:
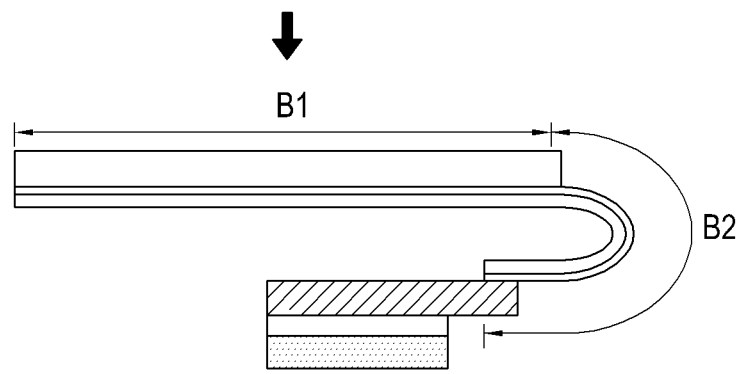

After a region of the polymer layer 940 is suctioned through the suction device 990, it is possible to perform a process in which the region of the polymer layer 940 and the display layer 910 and 930 connected to the polymer layer 940 are bent (process 50 in FIG. 9) (FIG. 10C). For example, the display layer may be bent such that a part of the second face of the display layer 910 and 930, which faces in the second (−Z) direction, faces the first face of the flexible PCB 920. The bent region may be a region of the wiring layer 930 of the display layer.

According to various embodiments, the polymer layer 940 is pressed and rotated in a selected direction by a manual process of the user or an automated process of the suction device, and a partial region of the display device is able to be bent to face in the second (−Z) direction. The display device may include a flexible substrate so as to be freely bendable.

According to various embodiments, the polymer layer 940 and a partial region of the display (e.g., the flexible PCB 920 and the circuit film 930) may be rotated 180 degrees by the bending process (process 50 in FIG. 9). For example, before bending, the front face of the polymer layer 940 may be disposed to face in the first (+Z) direction, but after bending, the front face of the polymer layer 940 may be reversed to face in the second (−Z) direction. As another example, before bending, the front face of the adhesive region P of the display device detached to the polymer layer 940 may be disposed to face in the first (+Z) direction, but after bending, the front face of the adhesive region P may be reversed to face in the second (−Z) direction.

According to various embodiments, the display layer 910 and 930 may include a flat region B1 and a bent region B2 according to the bending process. The bent region B2 may be disposed adjacent to the adhesive region P and may be rotated and folded according to the bending process of the wiring layer 930.

Figure 10D:
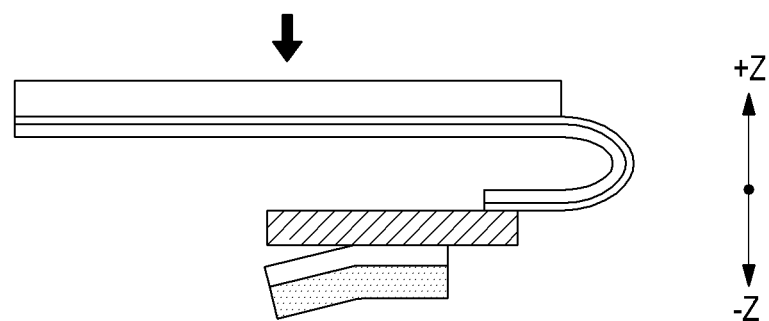

After the bending process, it is possible to perform a process of removing the polymer layer 940 from the flexible PCB 920 (process 60 in FIG. 9) (FIG. 10D).

A first adhesive layer 941 is disposed between the polymer layer 940 and the flexible PCB 920 so that the polymer layer 940 and the flexible PCB 920 are attached to each other. The polymer layer 940 may be fabricated to include an inorganic material having a hexagonal crystal structure such that the adhesive force is variable depending on a temperature condition.

According to various embodiments, the process of removing the polymer layer 940 from the flexible PCB 920 (process 60 in FIG. 9) may be performed under a high temperature condition (e.g., for more than minutes at a temperature of 50 degrees or more) in order to reduce the strong adhesive force of the polymer layer 940. Since the adhesive force of the polymer layer 940 according to the temperature condition has been described above (see Table 1), the description thereof is omitted.

FIGS. 11A to 11D are simplified views illustrating a method of manufacturing a display using a polymer layer 1040, according to various embodiments.

FIGS. 11A to 11D are flowcharts in which at least one sensor 1050 is additionally disposed on one face of a flexible PCB 1020 in the bending process (e.g., process 50 of FIG. 9) of FIGS. 10A to 10D. The method of manufacturing a display using the polymer layer 1040 as illustrated FIGS. 11A to 11D may be partially or entirely the same as the method of manufacturing a display using the polymer layer 940 as illustrated in FIG. 9 and FIGS. 10A to 10D.

Figure 11A:
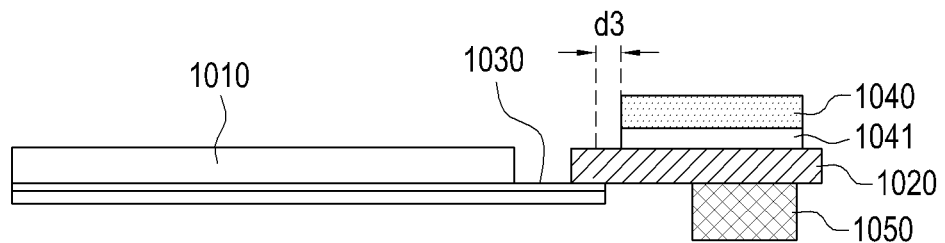
FIGS. 11A, 11B, 11C, and 11D are simplified views illustrating a method of manufacturing a display using a polymer layer 1040, according to various embodiments.

Referring to FIGS. 11A to 11D, in the manufacturing method of the display device, after a flexible PCB 1020 and a polymer layer 1040 are provided (process in FIG. 9), it is possible to perform a process of maintaining a first structure in which the polymer layer 1040 is attached (directly or indirectly) to the front face of the provided flexible PCB 1020 (process in FIG. 9) (FIG. 11A). A first adhesive layer 1041 may be provided between the polymer layer 1040 and the flexible PCB 1020 such that the adhesive layer 1041 attaches the polymer layer 1040 and the flexible PCB 1020 to each other. The polymer layer 1040 may be fabricated to include an inorganic material having a hexagonal crystal structure such that the adhesive force varies depending on a temperature condition.

In a process before or after the polymer layer 1040 is attached (directly or indirectly) to the flexible PCB 1020, at least one sensor 1050 may be provided on a face of the flexible PCB 1020, which faces in the second (−Z) direction. The at least one sensor 1050 may be any one of a fingerprint sensor, a touch sensor, and a pressure sensor. The at least one sensor 1050 may be disposed face to face the polymer layer 1040 with the flexible PCB 1020 interposed therebetween, and the display device may implement various user inputs (e.g., a three-dimensional input) through a combination of two or more of the above-mentioned sensors.

After the polymer layer 1040 is attached (directly or indirectly) to one face of the flexible PCB 1020, which faces in the first (+Z) direction and the at least one sensor 1050 is disposed on the other face, which faces in the second (−Z) direction, a process in which a partial region of the other face of the flexible PCB 1020 is attached to a partial region of the one face of the wiring layer 1030, which faces in the first (+Z) direction (process in FIG. 9) (FIG. 11A). The wiring layer 1030 of the display layer is the underlayer of the display element layer 1010 of the display layer and may include a flexible board. In process 30, the flexible PCB 1020 and the wiring layer 1030 may be electrically connected to each other.

Thereafter, it is possible to perform a suction process (process 40 in FIG. 9) (FIG. 11C) in a partial region of the polymer layer 1040 through a suction device 1090 the polymer layer 1040. The suction device 1090 may include a suction pad for suctioning a mixed gas or air, and the suction pad may be in contact with the suction region of the polymer layer 1040 to perform suction. Since the specific contents of the suction process and the structure of the polymer layer 1040 are the same as those described above, the foregoing descriptions will be applied thereto.

Figure 11B:
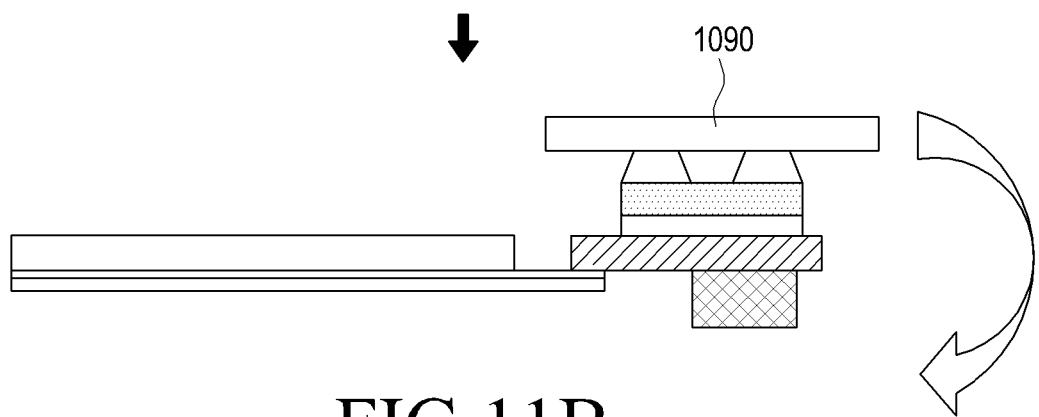
Figure 11C:
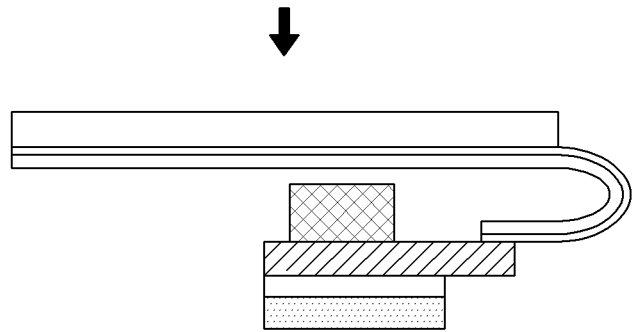
Figure 11D:
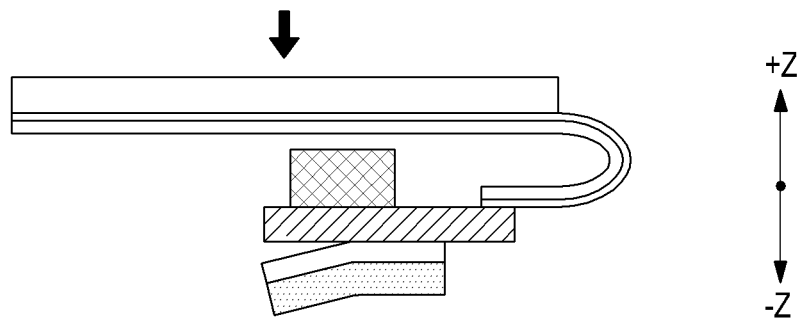

After a region of the polymer layer 1040 is suctioned through the suction device, it is possible to perform a process in which the polymer layer 1040 and the region of the display layer attached to the polymer layer 1040 are bent (process 50 in FIG. 9) (FIG. 11D). Through the bending process, the positions of the wiring layer 1030 and the flexible PCB 1020 (to which the polymer layer 1040 and at least one sensor 1050 are attached) can be reversed. For example, before bending, the front face of the polymer layer 1040 may be disposed to face in the first (+Z) direction, but after bending, the front face of the polymer layer 1040 may be reversed to face in the second (−Z) direction. As another example, before bending, the at least one sensor 1050 may be disposed to face in the second (−Z) direction, but after bending, the at least one sensor 1050 may be reversed to face in the first (+Z) direction. After the bending process, the at least one sensor 1050 may be disposed to face the display element layer 1010.

After the bending process, it is possible to perform a process of removing the polymer layer 1040 from the PCB 1020 (process 60 in FIG. 9).

Figure 13:
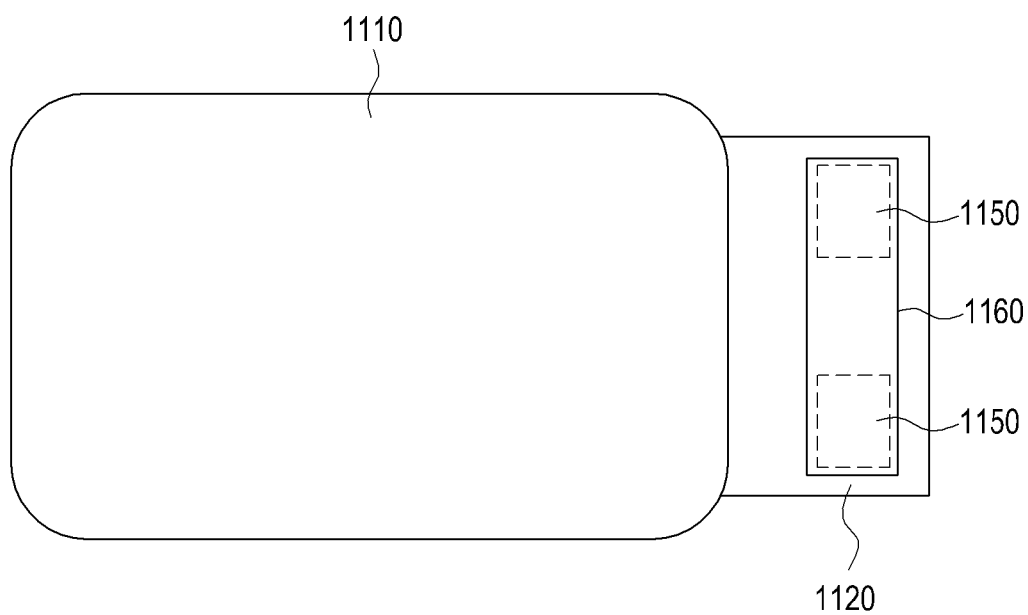
FIG. 13 is a top view of illustrating an adhesive film 1160 disposed on a PCB, according to various embodiments.
Figure 14A:
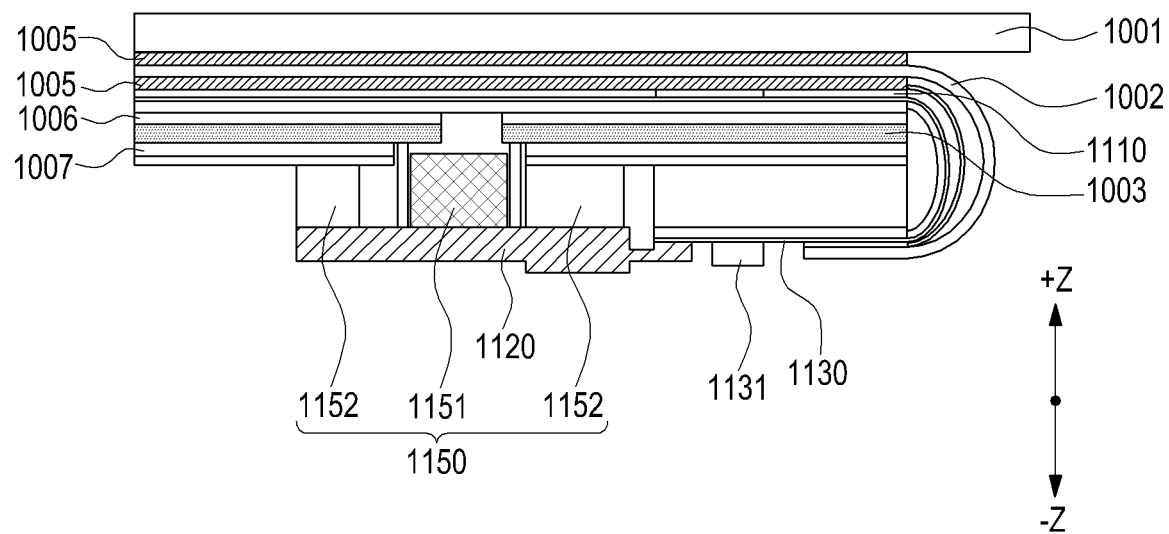
FIGS. 14A and 14B are cross-sectional views illustrating in detail the structure of FIG. 12D.
Figure 14B:
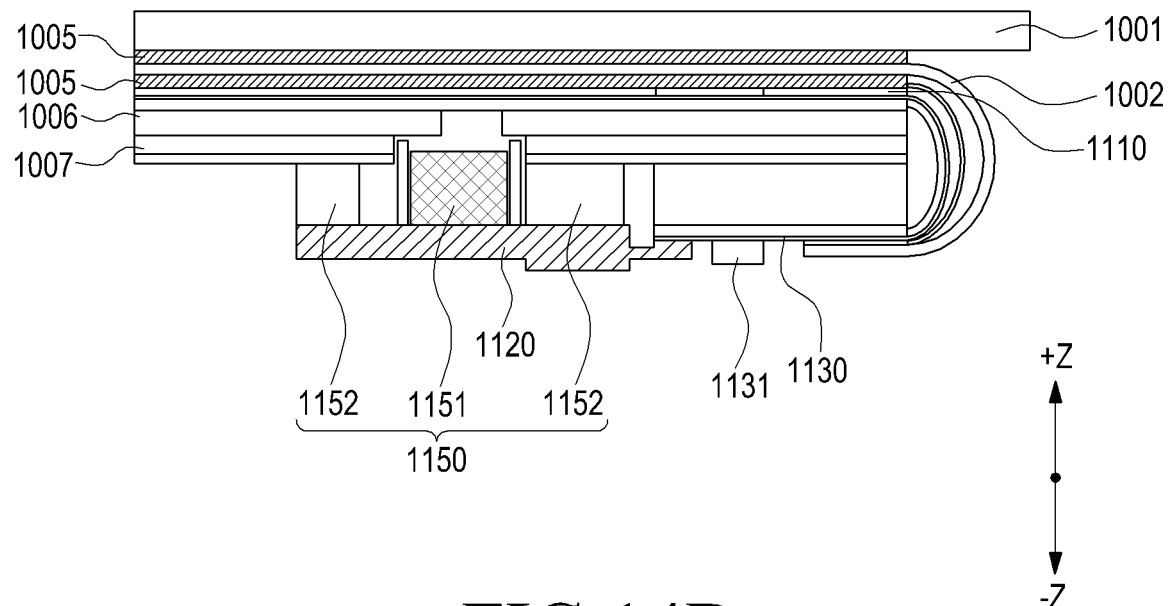

FIGS. 12A to 12D are simplified views illustrating a method of manufacturing a display using a polymer layer 1140, according to various embodiments. FIG. 13 is a top view of illustrating an adhesive film 1160 disposed on a PCB, according to various embodiments. FIGS. 14A and 14B are cross-sectional views illustrating the structure of FIG. 12D.

FIGS. 12A to 12D are flowcharts in which a process in which an adhesive film 1160 is additionally disposed on the at least one sensor 1150 disposed on one face of a flexible PCB 1120 in the bending process (e.g., process 50 of FIG. 9) of FIGS. 10A to 10D. A method of manufacturing a display device using the polymer layer 1140 as illustrated FIGS. 12A to 12D may be partially or entirely the same as the method of manufacturing a display device using the polymer layer 940 or 1040 as illustrated in FIG. 10 and FIGS. 11A to 11D. Hereinafter, a process added to the embodiment of FIGS. 12A to 12D will be described.

Figure 12A:
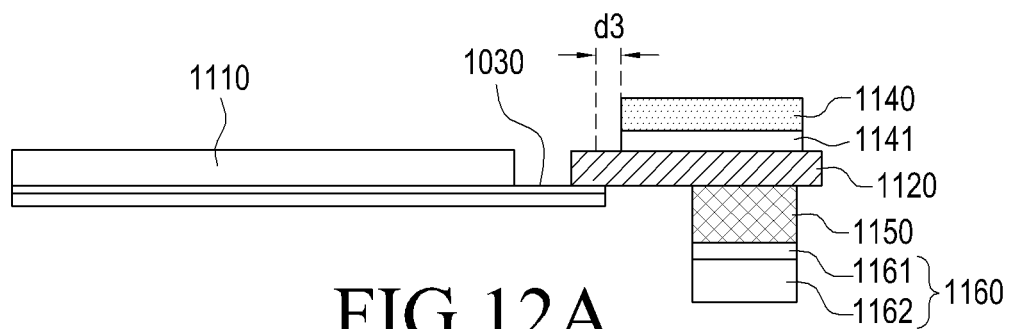
FIGS. 12A, 12B, 12C and 12D are simplified views illustrating a method of manufacturing a display using a polymer layer 1040, according to various embodiments.
Figure 12B:
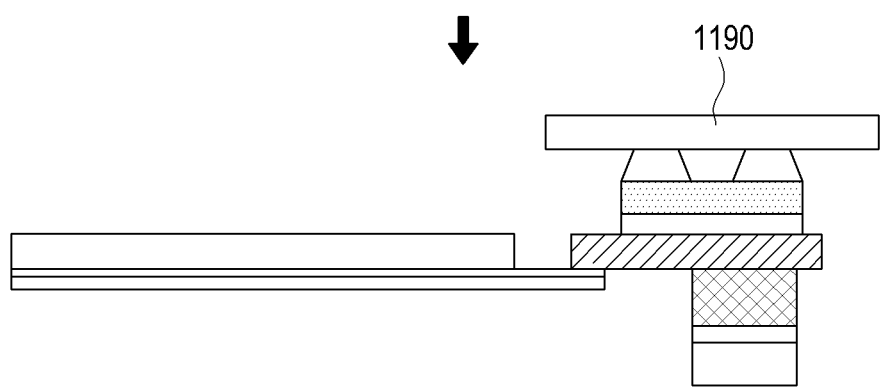

Referring to FIGS. 12A to 12D, in the manufacturing method of the display device, after a flexible PCB 1120 and a polymer layer 1140 are provided (process in FIG. 9), it is possible to perform a process in which the polymer layer 1140 is attached to the front face of the provided flexible PCB 1120 (process in FIG. 9) (FIG. 12A). A first adhesive layer 1141 may be provided between the polymer layer 1140 and the flexible PCB 1120 such that the adhesive layer 1141 attaches the polymer layer 1140 and the flexible PCB 1120 to each other. The polymer layer 1140 may be fabricated to include an inorganic material having a hexagonal crystal structure such that the adhesive force varies depending on a temperature condition.

In a process before or after the polymer layer 1140 is attached to the flexible PCB 1120, at least one sensor 1150 may be provided on a face of the flexible PCB 1120, which faces in the second (−Z) direction. The at least one sensor 1150 may be any one of a fingerprint sensor, a touch sensor, and a pressure sensor. The at least one sensor 1150 may be disposed to face the polymer layer 1140 with the flexible PCB 1120 interposed therebetween.

According to various embodiments, an adhesive film 1160 may be disposed on one face of the at least one sensor 1150. The adhesive film 1160 may include an adhesive resin 1161 and a release film 1162. For example, with reference to the at least one sensor 1150 disposed to face the second (−Z) direction on the flexible PCB 1120, the adhesive resin 1161 and a release film 1162 may be stacked in the second (−Z) direction.

Thereafter, it is possible to perform a suction process (process 40 in FIG. 9) (FIG. 12C) in a partial region of the polymer layer 1140 through a suction device 1190 the polymer layer 1040. After the adsorption process, it is possible to perform a process of removing the release film 1162 from the adhesive film 1160 attached to the at least one sensor 1150. The release film 1162 may be a film temporarily attached in order to protect the adhesive face of the adhesive film 1160.

Referring to FIG. 13, the adhesive resin 1161 and the release film 1162, which constitute the adhesive film 1160, may be fabricated to have different sizes. For example, due to the mounting space of the flexible PCB 1120 (e.g., a digitizer FPCB) or the like extending from the display element layer 1110 (e.g., a digitizer) of the display device, the sensors (e.g., pressure sensors) may be disposed to be spaced apart from each other. Adhesive resins 1161 may be formed to have a size corresponding to the size of the sensors 1150, which are spaced apart from each other, and may be individually attached to the sensors 1150. The release film 1162 may be formed to have a size capable of covering a plurality of sensors 1150, which are spaced apart from each other, and may be disposed on one face of the adhesive resin 1161. For example, a partial region of the release film 1162 may be disposed to overlap the plurality of sensors, and the other region may be disposed to face only a flexible PCB (a region where the plurality of sensors is not disposed). The release film 1162 can be easily removed before the bending process (process 50 in FIG. 9) (FIG. 12C).

Figure 12C:
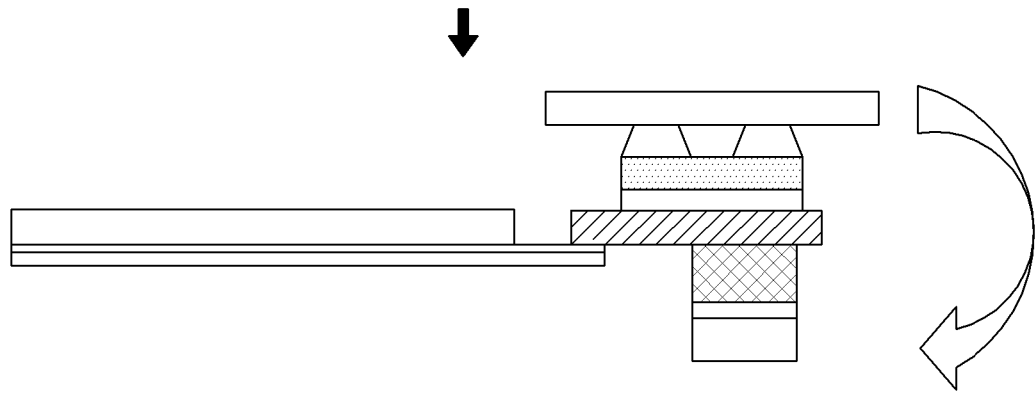

Thereafter, it is possible to perform a process in which the polymer layer 1140 and one region of the display region attached to the polymer layer 1140 (process 50 in FIG. 9) (FIG. 12C). Through the bending process, the positions of a partial region of the wiring layer 1130 and the flexible PCB 1120 (to which the polymer layer 1140 and at least one sensor 1150 are attached) can be reversed. For example, before bending, the front face of the polymer layer 1140 may be disposed to face in the first (+Z) direction, but after bending, the front face of the polymer layer 1140 may be reversed to face in the second (−Z) direction.

As another example, before bending, the at least one sensor 1150 may be disposed to face in the second (−Z) direction, but after bending, the at least one sensor 1150 may be reversed to face in the first (+Z) direction. After the bending process, the at least one sensor 1150 may be disposed to face the lower face of the display element layer 1110, and the adhesive resin 1161 exposed due to the removal of the release film 1162 may be attached to a partial region of the display layer 1110, which faces in the second (−Z) direction.

After the bending process, it is possible to perform a process of removing the polymer layer 1140 from the PCB 1120 (process 60 in FIG. 9).

Figure 12D:
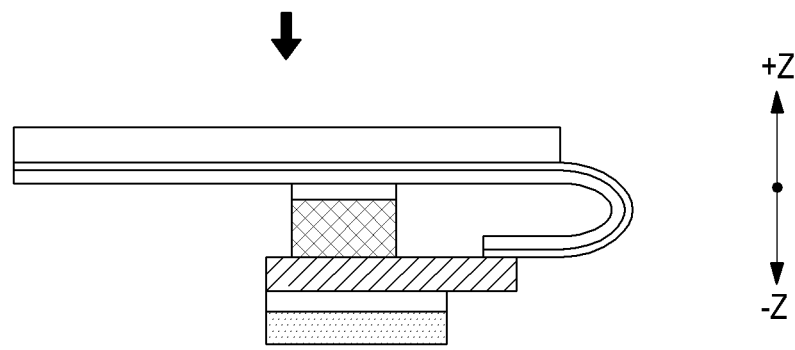

FIGS. 14A and 14B are cross-sectional views illustrating the structure of FIG. 12D in detail. Referring to FIG. 14A, a display device may be provided in which an optical member and/or a touch sensor panel 1002, a display element layer 1110, and a digitizer 1003 (not illustrated) are sequentially disposed in the second (−Z) direction with respect to the glass plate 1001 disposed on the outer face. A dielectric layer 1005 may be disposed between respective panels, and an emboss member 1006, a cushion member 1007, and the like may be disposed on the upper and lower faces of the digitizer 1003. The flexible PCB 1120 and one or more sensors 1150 may be disposed in the second (−Z) direction of the display layer according to the bending process. The one or more sensors 1150 may be a pressure sensor 1152 and a fingerprint sensor 1151, which may be disposed on the single flexible PCB 1120. In another example, the wiring layer 1130 may be disposed adjacent to the flexible PCB 1120 and may be electrically connected to the flexible PCB 1120. A Display IC (D-IC) 1131, a Touch Sensor Panel IC (TSP-IC), and the like may be disposed on one face of the wiring layer 1130.

Referring to FIG. 14B, FIG. 14B is a cross-sectional view illustrating a structure in which the digitizer does not exist in the structure of FIG. 14A. An electronic device may include a display device in which an optical member and/or a touch sensor panel 1002 and a display element layer 1110 are sequentially disposed in the second (−Z) direction with respect to the glass plate 1001 disposed on the outer face. A dielectric layer 1005 may be disposed between respective panels, and an emboss member 1006, a cushion member 1007, and the like may be disposed on the lower face of the display element layer 1110. The flexible PCB 1120 and one or more sensors 1150 may be disposed in the second (−Z) direction of the display layer according to the bending process. The one or more sensors 1150 may be a pressure sensor 1152 and a fingerprint sensor 1151, which may be disposed on the single flexible PCB 1120.

Figure 15A:
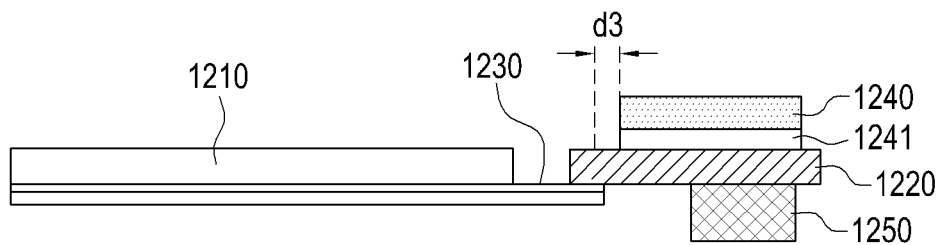
FIGS. 15A, 15B, and 15C are simplified views illustrating a method of manufacturing a display using a polymer layer 1240, according to various embodiments.
Figure 15B:
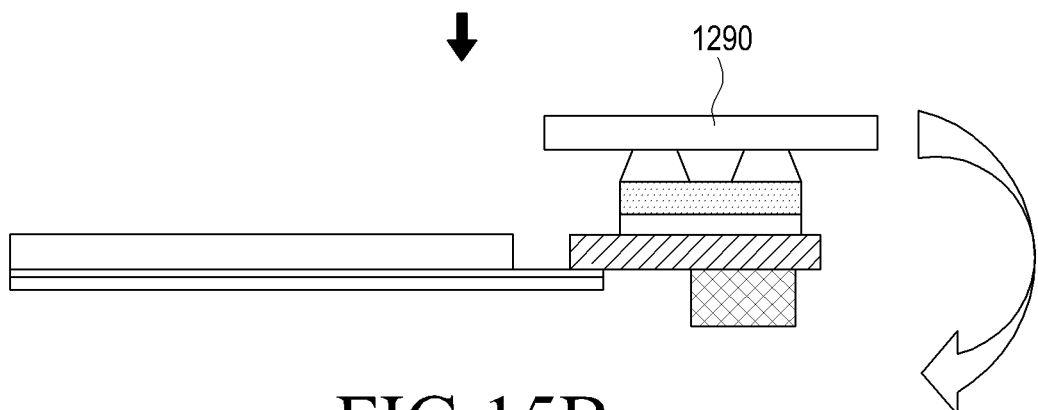
Figure 15C:
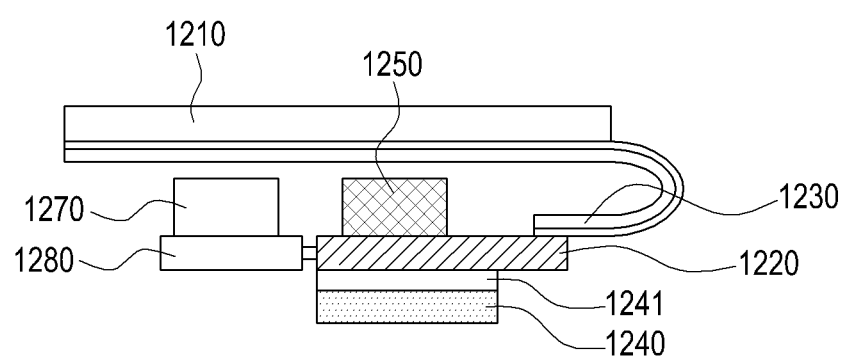
Figure 16:
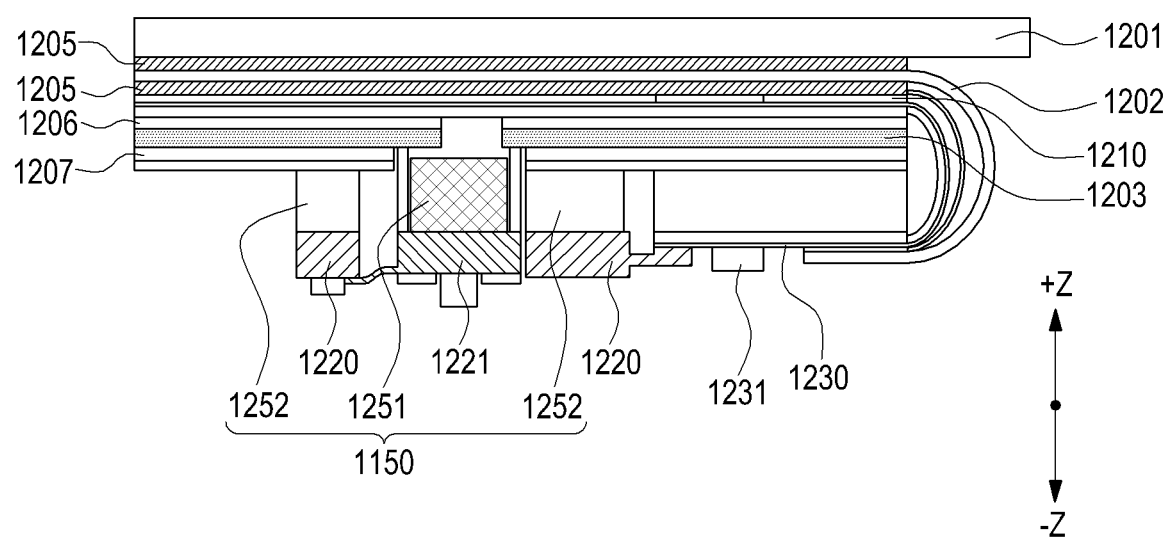
FIG. 16 is a cross-sectional view illustrating in detail the structure of FIG. 15C.

FIGS. 15A to 15C are simplified views illustrating a method of manufacturing a display using a polymer layer 1240, according to various embodiments. FIG. 16 is a cross-sectional view illustrating in detail the structure of FIG. 15C.

FIGS. 15A to 15C are flowcharts in which in addition to at least one sensor 1050 disposed on one face of a flexible PCB 1020, an additional sensor is disposed in the bending process (e.g., process 50 in FIG. 9) of FIGS. 11A and 11B. A method of manufacturing a display device using a polymer layer 1240 as illustrated FIGS. 15A to 15C may be partially or entirely the same as the method of manufacturing a display device using the polymer layer 1040 as illustrated in FIGS. 11A to 11D. Hereinafter, the processes of the embodiment of FIGS. 11A to 11B are applied, and the processes after the process in which the polymer layer 1240 and one region of the display device attached to the polymer layer 1240 are bent (process 50 in FIG. 9) will be described.

Referring to FIGS. 15A to 15C, after the bending process (steps 50 in FIG. 9) (FIG. 15C), in addition to the at least one sensor (e.g., a first sensor 1250) attached to the flexible PCB 1220 attached to the flexible PCB 1220, at least one sensor (e.g., a second sensor 1270) may be further disposed. For example, the first sensor 1250 may be a pressure sensor, and the second sensor 1270 may be a fingerprint sensor.

According to various embodiments, the second sensor 1270 may be disposed adjacent to the first sensor 1250. For example, the second sensor 1270 may be disposed parallel with a side face of the first sensor 1250. When a plurality of first sensors 1250 is disposed, the second sensor 1270 may be disposed between the first sensors 1250.

According to various embodiments, the second sensor 1270 may be mounted on a second sensor PCB 1280 separately from the first sensor 1250, and may be electrically connected to the flexible PCB 1220 on which the first sensor 1250 is mounted. The second sensor PCB 1280 may be disposed in an opened region of the flexible PCB 1220. As another example, the second sensor PCB 1280 may include a flexible PCB.

After the second sensor 1270 is additionally disposed, it is possible to perform a process of removing the polymer layer 1240 from the PCB 1220 (process 60 in FIG. 9) (FIG. 13C).

FIG. 16 is a cross-sectional view illustrating the structure of FIG. 15C in detail. A display layer may be provided in which an optical member and/or a touch sensor panel 1202, a display element layer 1210, and a digitizer 1203 (not illustrated) are sequentially disposed in the second (−Z) direction with respect to the glass plate 1201 disposed on the outer face. A dielectric layer 1205 may be disposed between respective panels, and an emboss member 1206, a cushion member 1207, and the like may be disposed on the upper and lower faces of the digitizer 1203. The flexible PCB 1220 and one or more sensors 1250 may be disposed in the second (−Z) direction of the display layer according to the bending process. The one or more sensors 1250 may include a pressure sensor 1252. A fingerprint sensor 1251 may be disposed adjacent to the pressure sensor 1252, the PCB 1221 on which the fingerprint sensor 1251 is disposed may be disposed separately from a flexible PCB 1220, and the PCB 1221 and the flexible PCB 1220 may be electrically connected to each other.

In another example, the wiring layer 1230 may be disposed adjacent to the flexible PCB 1220 and may be electrically connected to the flexible PCB 1120. A Display IC (D-IC) 1231, a Touch Sensor Panel IC (TSP-IC), and the like may be disposed on one face of the wiring layer 1230.

Figure 17A:
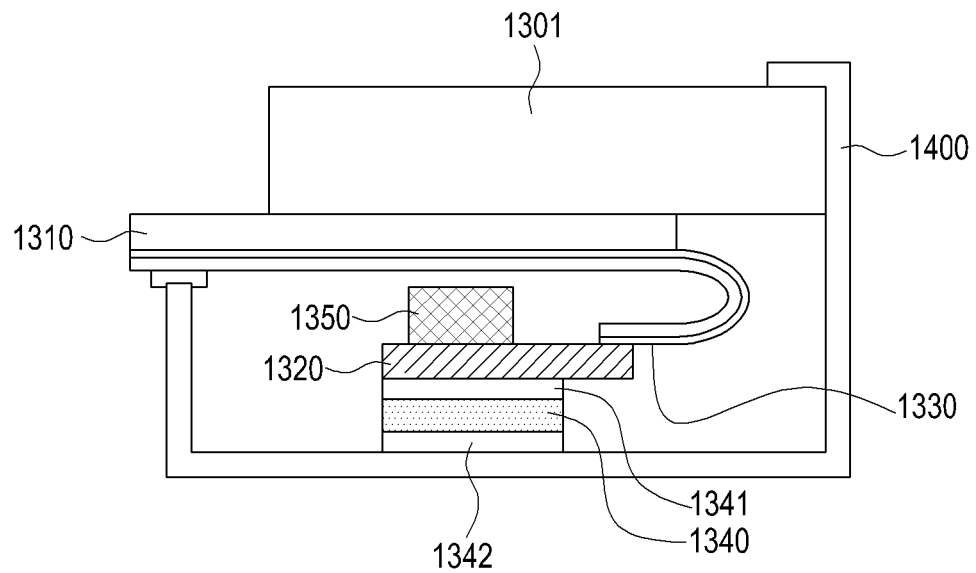
FIGS. 17A and 17B are simplified views illustrating a method of manufacturing a display using a polymer layer 1340, according to various embodiments.
Figure 17B:
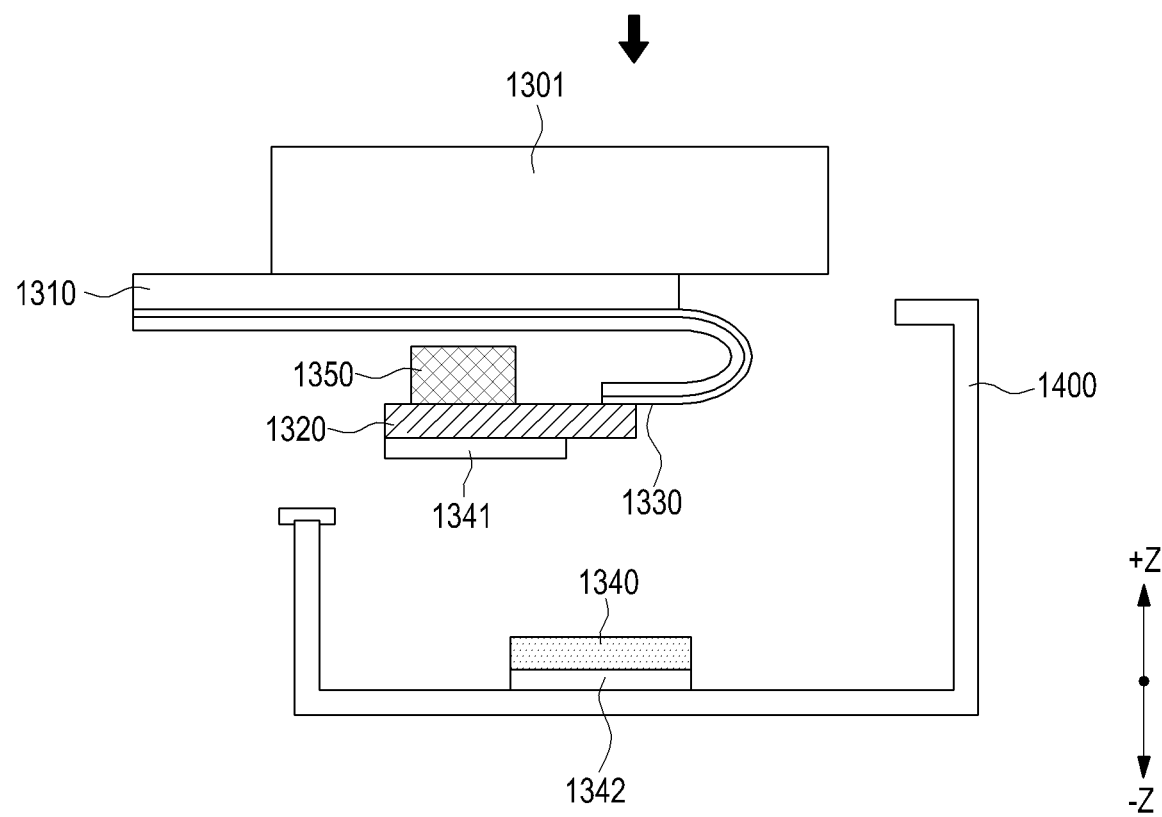

FIGS. 17A and 17B are simplified views illustrating a method of manufacturing a display using a polymer layer 1340, according to various embodiments.

FIGS. 17A and 17B are flowcharts in which a process of covering a polymer layer 1340 is added in the bending process of FIGS. 11A to 11D (e.g., process 50 in FIG. 9). A method of manufacturing a display device using a polymer layer 1340 as illustrated FIGS. 17A to 15C may be partially or entirely the same as the method of manufacturing a display device using the polymer layer 1040 as illustrated in FIGS. 11A to 11D.

Hereinafter, the processes of the embodiment of FIGS. 11A to 11D are applied, and the processes after the process in which the polymer layer 1340 and one region of the display attached to the polymer layer 1340 are bent (process 50 in FIG. 9) will be described.

Referring to FIG. 17, after the bending process (process 50 in FIG. 9), it is possible to perform processes of disposing and removing a cover structure 1400 covering the polymer layer 1340 (process 60 in FIG. 9) (FIGS. 17A and 17B).

According to various embodiments, it is possible to perform a process in which the cover structure 1400 is disposed from the glass plate 1301 to the rear face of the flexible display device (FIG. 17A). For example, the cover structure 1400 may cover a partial region of the display device (e.g., the display element layer 1310, the wiring layer 1330 under the display element layer, and the flexible PCB 1320), on which the bending process has been performed, in order to prevent (or reduce the likelihood of) the partial region from being damaged by an external impact. The cover structure 1400 may be disposed to enclose at least a part of the flexible PCB 1320, the flexible display layer 1310 and 1330, and the polymer layer 1340, and may be connected to a partial region of the glass plate 1301 and the polymer layer 1340. For example, the cover structure 1400 may be connected to at least a part of one face of the glass plate 1301, which faces in the first (+Z) direction and/or at least a part of a side face of the glass plate 1301. As another example, the cover structure 1400 may be connected to one face of the polymer layer 1340, which faces in the second (−Z) direction. As another example, another region of the cover structure 1400 may be connected to the bottom face of the flexible display layer 1310 and 1330, which faces in the second (−Z) direction. According to the arrangement described above, the cover structure 1400 may cover a partial region of the display device (e.g., the display layer 1310 and 1330 and the flexible PCB 1320), on which the bending process has been performed, in order to prevent (or reduce the likelihood of) the partial region from being damaged by an external impact.

According to various embodiments, on a part of the inner face of the cover structure 1400, which faces in the first (+Z) direction, an adhesive layer (e.g., a second adhesive layer 1342) attached to the polymer layer 1340 may be disposed. The second adhesive layer 1342 may have a physical property which is different from the first adhesive layer 1341 disposed between the flexible PCB 1320 and the polymer layer 1340.

Thereafter, it is possible to perform a process of removing the cover structure 1400 (FIG. 14B). The cover structure 1400 may be removed together with the polymer layer 1340 attached to the flexible PCB 1320.

According to various embodiments, the second adhesive layer 1341 disposed between the cover structure 1400 and the polymer layer 1340 may include a material having an adhesive force stronger than that of the first adhesive layer 1341 disposed between the polymer layer 1340 and the flexible PCB 1320. When the cover structure 1400 is removed, the polymer layer 1340 attached to the second adhesive layer 1342 having the stronger force can be removed.

According to various embodiments, an electronic device (e.g., the electronic device 300 in FIG. 3A) may include: a glass plate (e.g., the glass plate 310 in FIG. 3A) including a first face (e.g., the first face 311 in FIG. 3A) that faces in a first direction, a second face (e.g., the second face 312 in FIG. 3A) that faces in a second direction opposite the first direction, and a side face (e.g., the side face 313 in FIG. 3A) that faces in a third direction substantially perpendicular to the first direction; a flexible PCB (e.g., the flexible PCB 320 in FIG. 3A) including a first face (e.g., the first face 321 in FIG. 3A) that faces the second face of the glass plate in the first direction, and a second face (e.g., the second face 322 in FIG. 3A) that faces in the second direction; a flexible display layer (e.g., the flexible display layer 330 in FIG. 3A) including a flat portion (e.g., the flat portion 335 in FIG. 3A) disposed between the second face of the glass plate and the first face of the flexible PCB, and a bent portion (e.g., the bent portion 336 in FIG. 3A) extending from the flat portion and bent to be connected to the flexible PCB; a polymer layer (e.g., the polymer layer 340 in FIG. 3A) including a first face (e.g., the first face 341 in FIG. 3A) that faces in the first direction and is attached to the second face of the flexible PCB and a second face (e.g., the second face 342 in FIG. 3A) that faces in the second direction; and a cover structure (e.g., the cover structure 350 in FIG. 3A) that is connected to the glass plate and the polymer layer so as to enclose at least a part of the flexible PCB, the flexible display layer, and the polymer layer.

According to various embodiments, the electronic device may further include an adhesive layer (e.g., the adhesive layer 360 in FIG. 3A) disposed between the second face of the flexible PCB and the first face of the polymer layer.

According to various embodiments, the display layer may include an Organic Light-Emitting Diode (OLED).

According to various embodiments, the polymer layer may include at least one of polyethylene terephthalate (PET), boron nitride (BN), graphine, carbon nano-tube (CNT), and graphite.

According to various embodiments, the cover structure may be connected to a part of the first face of the glass plate and/or at least a part of a side face of the glass plate.

According to various embodiments, the cover structure may be connected to the second face of the polymer layer.

According to various embodiments, the electronic device may further include an adhesive layer (e.g., the adhesive layer 370 in FIG. 3A) disposed between the second face of the polymer layer and the cover structure.

According to various embodiments, the electronic device may further include at least one sensor (e.g., the sensor 380 in FIG. 3A) disposed between the display layer and the flexible PCB.

According to various embodiments, the bent portion of the display layer may be connected to a part of the first face of the flexible PCB.

According to various embodiments, the first face (e.g., the first face 420 in FIG. 4) of the polymer layer (e.g., the polymer layer 400 in FIG. 4) may include at least one recess (e.g., the recess 440 in FIG. 4) that is disposed in a region corresponding to at least one electronic component disposed to protrude on the second face of the flexible PCB and is configured to accommodate the electronic component therein.

According to various embodiments, the at least one recess in the polymer layer may include a groove formed to face in the second direction from the first face and the groove may include a closed line-shaped groove or a line-shaped groove having at least one opened end, the at least one electronic component being inserted into the line-shaped groove.

According to various embodiments, the at least one recess in the polymer layer may include at least one opening that is disposed such that the at least one electronic component is exposed outwardly, and the polymer layer may have a thickness greater than a thickness of the electronic component.

According to various embodiments, at least a part of the second face of the polymer layer may include a suction region (e.g., the suction region 530 in FIG. 5A), the suction region may include at least one suction hole (the suction hole 531 in FIG. 5A) at a position corresponding to a suction pad of a suction device configured to perform vacuum suction, and the at least one suction hole may have a diameter smaller than a diameter of the suction pad.

According to various embodiments, the first face of the polymer layer may include a plurality of fine holes (e.g., the fine holes 631 in FIG. 6A) or a groove-shaped line structure (e.g., the line structure 731 in FIG. 6B) configured to allow air bubbles between the flexible PCB and the first face of the polymer layer to be discharged outwardly when the first face of the polymer layer is attached to the flexible PCB.

According to various embodiments, the at least one recess in the polymer layer may be formed in a region in which a signal line for checking an electrical connection state between the display element layer of the display device and the flexible PCB is disposed, and may be opened such that the signal line is exposed outwardly.

According to various embodiments, a method of manufacturing an electronic device may include: maintaining a first structure including a PCB having a first face and a second face and a polymer layer attached to the first face of the PCB; attaching a part of the second face of the PCB to a first face of the flexible display layer; and bending a part of the display layer away from the first structure such that a part of the second face of the display layer faces the second face of the PCB. The second face of the display layer may face away from the first face of the display layer.

According to various embodiments, the bending of the display layer may include causing the first structure to move such that the display layer is bent.

According to various embodiments, the polymer layer may include at least one of polyethylene terephthalate (PET), boron nitride (BN), graphine, carbon nano-tube (CNT), and graphite.

According to various embodiments, the attaching of a part of the second face of the PCB may include applying an Anisotropic Conductive Film (ACF).

According to various embodiments, there is provided a method of manufacturing an electronic device having a component that includes: a glass plate having a first face that faces in a first direction, a second face that faces in a second direction opposite the first direction, and a side face that faces in a third direction substantially perpendicular to the first direction; a flexible PCB having a first face that faces the second face of the glass plate in the first direction, and a second face that faces in the second direction; a flexible display layer having a flat portion that is disposed between the second face of the glass plate and the first face of the flexible PCB, and a bent portion that extends from the flat portion and is bent to be connected to the flexible PCB; a polymer layer having a first face that faces in the first direction and is attached to the second face of the flexible PCB and a second face that faces in the second direction; and a cover structure that is connected to the glass plate and the polymer layer so as to enclose at least a part of the flexible PCB, the flexible display layer, and the polymer layer. The method may include: removing the cover structure and the polymer layer from the component by applying heat to the cover structure; and attaching at least one of a camera and a speaker to the component.

While the present disclosure has been shown and described with reference to certain embodiments thereof, it will be apparent to those skilled in the art that the camera lens module according to the present disclosure is not limited to these embodiments, and various changes in form and details may be made therein without departing from the spirit and scope of the present disclosure as defined by the appended claims.

What is claimed is:

1. An apparatus comprising:
a glass plate including a first major surface facing in a first direction, a second major surface facing in a second direction opposite from the first direction, and a side surface facing in a third direction substantially perpendicular to the first direction;
a flexible printed circuit board (FPCB) including a first surface facing the second major surface of the glass plate in the first direction, and a second surface facing in the second direction;
a flexible display layer including a planar portion between the second major surface of the glass plate and the first surface of the FPCB, and a bent portion extending from the planar portion and bent to connect to the FPCB;
a polymer layer including a first major surface facing in the first direction and attached to the second surface of the FPCB, and a second major surface facing in the second direction; and
a cover structure connected to the glass plate and to the polymer layer to enclose at least portion of the FPCB, the flexible display, and the polymer layer,
wherein at least a part of the second major surface of the polymer layer includes a suction region,
wherein the suction region includes at least one suction hole at a position corresponding to a suction pad of a suction device configured to perform vacuum suction, and the at least one suction hole has a diameter smaller than a diameter of the suction pad.

2. The apparatus of claim 1, further comprising:
an adhesive layer between the second surface of the FPCB and the first major surface of the polymer layer.

3. The apparatus of claim 1, wherein the display layer includes organic light emitting diodes (OLEDs).

4. The apparatus of claim 1, wherein the polymer layer includes at least one of polyethylene terephthalate (PET), boron nitride (BN), graphine, carbon nano-tube (CNT), or graphite.

5. The apparatus of claim 1, wherein the cover structure is connected to a portion of the first major surface of the glass plate and/or at least a portion of the side surface of the glass plate.

6. The apparatus of claim 5, wherein the cover structure is further connected to the second major surface of the polymer layer.

7. The apparatus of claim 6, further comprising:
an adhesive layer between the second major surface of the polymer layer and the cover structure.

8. The apparatus of claim 1, further comprising:
at least one sensor between the display layer and the FPCB.

9. The apparatus of claim 1, wherein the bent portion of the display layer is connected to a portion of the first surface of the FPCB.

10. The apparatus of claim 1, wherein the first major surface of the polymer layer has at least one recess that is disposed in a region corresponding to at least one electronic component disposed to protrude on the second surface of the flexible PCB and is configured to accommodate the electronic component therein.

11. The apparatus of claim 10, wherein the at least one recess in the polymer layer includes a groove formed to face in the second direction from the first major surface, and the groove includes a closed line-shaped groove and a line shaped opening having at least one opened end, the at least one electronic component being inserted into the line-shaped groove.

12. The apparatus of claim 10, wherein the at least one recess in the polymer layer has at least one opening that is disposed such that the at least one electronic component is exposed outwardly, and
the polymer layer has a thickness greater than a thickness of the electronic component.

13. The device of claim 10, wherein the at least one recess in the polymer layer is formed in a region in which a signal line for checking an electrical connection state between the display element layer of the display device and the flexible PCB is disposed, and is opened such that the signal line is exposed outwardly.

14. The apparatus of claim 1, wherein the first major surface of the polymer layer has a plurality of fine holes or a groove-shaped line structure configured to allow air bubbles between the flexible PCB and the first major surface of the polymer layer to be discharged outwardly when the first face of the polymer layer is attached to the flexible PCB.

* * * * *